(12) United States Patent
Ono et al.

(10) Patent No.: US 11,651,971 B2
(45) Date of Patent: May 16, 2023

(54) ETCHING METHOD, SUBSTRATE PROCESSING APPARATUS, AND SUBSTRATE PROCESSING SYSTEM

(71) Applicant: TOKYO ELECTRON LIMITED, Tokyo (JP)

(72) Inventors: Kenta Ono, Miyagi (JP); Shinya Ishikawa, Miyagi (JP); Masanobu Honda, Miyagi (JP)

(73) Assignee: MAX CO., LTD., Tokyo (JP)

( * ) Notice: Subject to any disclaimer, the term of this patent is extended or adjusted under 35 U.S.C. 154(b) by 0 days.

(21) Appl. No.: 17/351,549

(22) Filed: Jun. 18, 2021

(65) Prior Publication Data
US 2021/0398818 A1 Dec. 23, 2021

(30) Foreign Application Priority Data

Jun. 19, 2020 (JP) .............................. JP2020-106121
Mar. 8, 2021 (JP) .............................. JP2021-036107

(51) Int. Cl.
*H01L 21/311* (2006.01)
*H01J 37/32* (2006.01)

(52) U.S. Cl.
CPC .. *H01L 21/31144* (2013.01); *H01J 37/32449* (2013.01); *H01J 37/32724* (2013.01); *H01L 21/31116* (2013.01)

(58) Field of Classification Search
None
See application file for complete search history.

(56) References Cited

U.S. PATENT DOCUMENTS

| | | | | |
|---|---|---|---|---|
| 8,043,662 | B2* | 10/2011 | Orihashi | C25D 5/48 205/300 |
| 8,052,880 | B2* | 11/2011 | Takemoto | H01L 33/60 29/853 |
| 8,864,896 | B2* | 10/2014 | Hidaka | C03C 17/30 106/287.19 |
| 9,605,156 | B2* | 3/2017 | Arfsten | G02B 1/113 |
| 9,780,037 | B2* | 10/2017 | Kato | H01L 21/76834 |
| 9,806,252 | B2* | 10/2017 | Tan | H01J 37/32651 |
| 10,998,191 | B2* | 5/2021 | Church | H01L 21/0332 |
| 11,107,683 | B2* | 8/2021 | Smith | C23C 16/042 |
| 2004/0178169 | A1* | 9/2004 | Desphande | H01L 21/31144 257/E21.252 |
| 2018/0286707 | A1 | 10/2018 | Hudson et al. | |
| 2020/0371439 | A1* | 11/2020 | Meyers | C23C 16/45561 |
| 2021/0193477 | A1* | 6/2021 | Ishikawa | H01L 21/32137 |
| 2021/0202260 | A1* | 7/2021 | Ishikawa | H01L 21/02205 |
| 2021/0233778 | A1* | 7/2021 | Tomura | H01L 21/32055 |
| 2021/0398818 | A1* | 12/2021 | Ono | H01J 37/32449 |

* cited by examiner

*Primary Examiner* — Allan W. Olsen
(74) *Attorney, Agent, or Firm* — Weihrouch IP

(57) ABSTRACT

An etching method includes forming a protective layer containing a tin atom on a surface of a substrate. The substrate has a region to be etched and a mask provided on the region. The etching method further includes etching the region in the substrate using the mask.

21 Claims, 15 Drawing Sheets

ETCHING METHOD, SUBSTRATE PROCESSING APPARATUS, AND SUBSTRATE PROCESSING SYSTEM

CROSS-REFERENCE TO RELATED APPLICATIONS

This application is based on and claims priority from Japanese Patent Application Nos. 2020-106121 and 2021-036107 filed on Jun. 19, 2020 and Mar. 8, 2021, respectively, with the Japan Patent Office, the disclosures of which are incorporated herein in their entireties by reference.

TECHNICAL FIELD

Embodiments of the present disclosure relate to an etching method, a substrate processing apparatus, and a substrate processing system.

BACKGROUND

In the manufacture of electronic devices, plasma etching is performed on films of a substrate. Plasma etching is applied to, for example, a silicon-containing film. In the plasma etching of the silicon-containing film, a processing gas including a fluorocarbon gas is used. Such plasma etching is described in, for example, U.S. Patent Publication No. 2018/0286707.

SUMMARY

In one embodiment, an etching method is provided. The etching method includes forming a protective layer on a surface of a substrate. The substrate has a region to be etched and a mask provided on the region. The protective layer contains a tin atom. The etching method further includes etching the region in the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
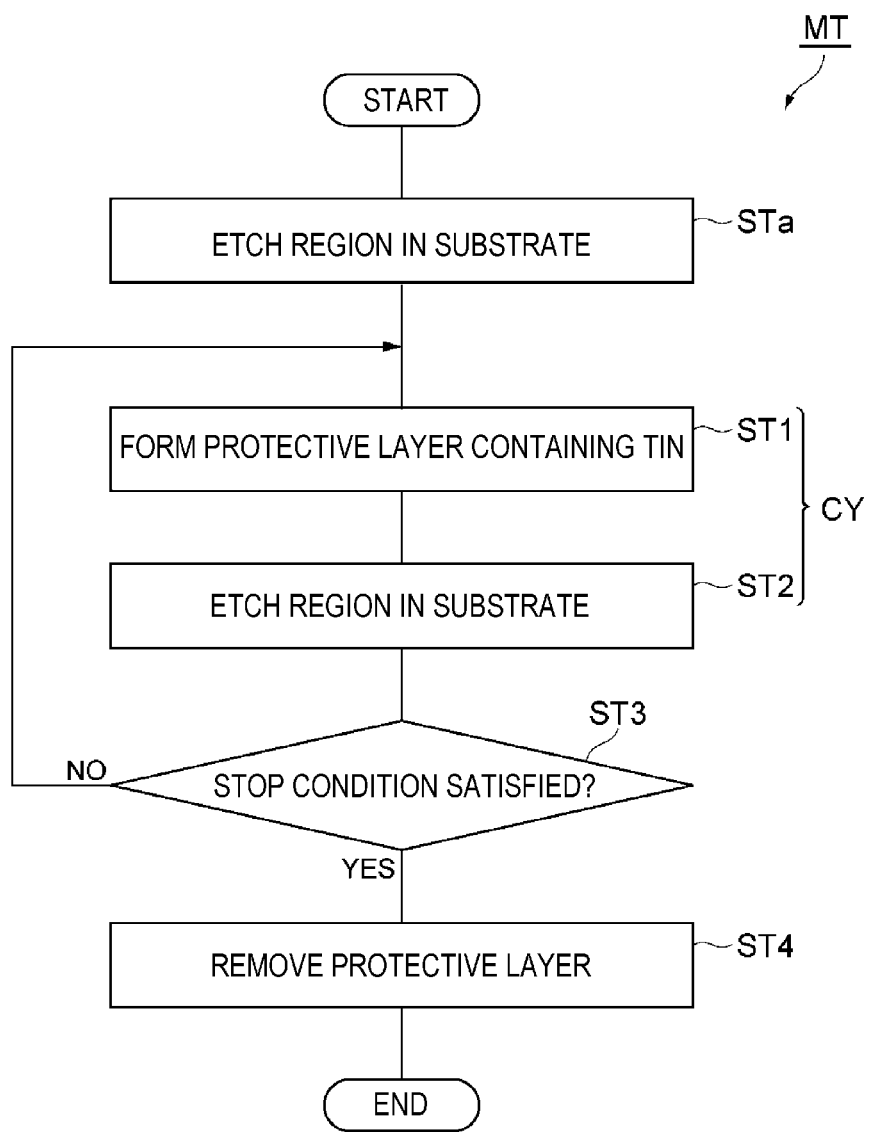
FIG. 1 is a flowchart of an etching method according to one embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, various embodiments will be described.

In one embodiment, an etching method is provided. The etching method includes (a) forming a protective layer on a surface of a substrate. The substrate has a region to be etched and a mask provided on the region. The protective layer contains a tin atom. The etching method further includes (b) etching the region in the substrate.

In the embodiment, the protective layer containing a tin (Sn) atom is formed on the surface of the substrate. Further, in the embodiment, the region in the substrate is etched. Accordingly, according to the embodiment, it is possible to etch the region in the substrate in a state where a sidewall surface provided by the surface and/or a region of a mask is protected. The etching of the layer may be plasma etching.

In one embodiment, step (b) may be performed after step a). In another embodiment, step (a) and step (b) may be performed at least partially simultaneously.

In one embodiment, step (a) may include (a-1) supplying a first gas to the substrate and (a-2) supplying a second gas to the substrate. In this embodiment, at least one of the first gas and the second gas may contain a tin-containing substance.

In one embodiment, a precursor layer may be formed on the surface of the substrate using the first gas in step (a-1), and a protective layer may be formed from the precursor layer using the second gas in step (a-2).

In one embodiment, the first gas may contain a tin-containing substance, and in step (a-2), the protective layer may be formed by oxidizing, nitriding, sulfurizing, reducing, or halogenating the precursor layer using the second gas.

In one embodiment, plasma may be generated from the second gas in step (a-2). In step b), the region in the substrate may be etched by chemical species from the plasma generated from the second gas while step (a-2) is performed. According to this embodiment, a high throughput may be obtained since step a-2) and step b) are performed at the same time.

In one embodiment, at least one of the first gas and the second gas may contain a tin-containing substance. A remaining one of the first gas and the second gas may contain $H_2O$, $H_2O_2$, $O_2$, $O_3$, $N_2O_4$, a nitrogen-containing inorganic compound, a sulfur-containing inorganic compound, a halogen compound, a carbon-containing substance, a silicon-containing substance, or a tin-containing substance. Alternatively, the remaining one of the first gas and the second gas may contain at least one of Na and an oxygen-containing substance. Chemical species from plasma generated from the remaining one of the first gas and the second gas may be supplied to the precursor layer containing a tin atom and formed on the surface of the substrate. At least one of the first gas and the second gas may be supplied to the precursor layer without generating the plasma therefrom.

In one embodiment, in step (a), a plurality of layer forming cycles each including step (a-1) and step (a-2) may be sequentially performed. Purging of the internal space of a chamber in which the substrate is accommodated may be performed between step (a-1) and step (a-2) and between step (a-2) and step (a-1).

In one embodiment, the condition for forming the precursor layer in at least one layer forming cycle among the plurality of layer forming cycles may be different from the condition for forming the precursor layer in at least another layer forming cycle among the plurality of layer forming cycles.

In one embodiment, the condition for forming the protective layer from the precursor layer in at least one layer forming cycle among the plurality of layer forming cycles may be different from the condition for forming the protective layer from the precursor layer in at least another layer forming cycle among the plurality of layer forming cycles.

In one embodiment, in step (a), the protective layer may be formed by a chemical vapor deposition method using a layer forming gas containing a tin-containing substance.

In one embodiment, the layer forming gas may further contain at least one of $N_2$, $H_2O$, $H_2O_2$, $O_2$, $O_3$, $N_2O_4$, an oxygen-containing substance, a nitrogen-containing inorganic compound, a sulfur-containing inorganic compound, a halogen compound, a carbon-containing substance, a silicon-containing substance, and a noble gas.

In one embodiment, the etching method may further include etching a region in the substrate before step (a) ("step (c)"). The protective layer may be formed in step (a) on a sidewall surface which defines an opening formed in the region in the substrate in step (c).

In one embodiment, the protective layer may have a thickness that varies according to a position in a depth direction within the opening.

In one embodiment, a plurality of cycles each including step (a) and step (b) may be sequentially performed.

In one embodiment, the condition for forming the protective layer in at least one cycle among the plurality of cycles may be different from the condition for forming the protective layer in at least another cycle among the plurality of cycles.

In one embodiment, the condition for etching a layer in at least one cycle among the plurality of cycles may be different from the condition for etching the layer in at least another cycle among the plurality of cycles.

In one embodiment, the layer to be etched may be a silicon-containing layer or an organic layer.

In another embodiment, a substrate processing apparatus is provided. The substrate processing apparatus includes a chamber, a substrate supporter unit, a gas supply, and a controller. The substrate supporter unit is configured to support a substrate in the chamber. The gas supply is configured to supply a gas into the chamber. The controller is configured to control the gas supply. The controller controls the gas supply so as to supply the gas into the chamber in order to form a protective layer containing a tin atom on a surface of the substrate supported by the substrate supporter. The controller controls the gas supply so as to supply the gas into the chamber in order to etch a region in the substrate.

In still another embodiment, a substrate processing system is provided. The substrate processing system includes a layer forming apparatus and a substrate processing apparatus. The layer forming apparatus is configured to form a protective layer containing a tin atom on a surface of a substrate. The substrate processing apparatus is configured to etch a region in the substrate.

Hereinafter, various embodiments will be described in detail with reference to the drawings. The same reference numerals are given to the same or corresponding parts in each drawing.

Figure 2:
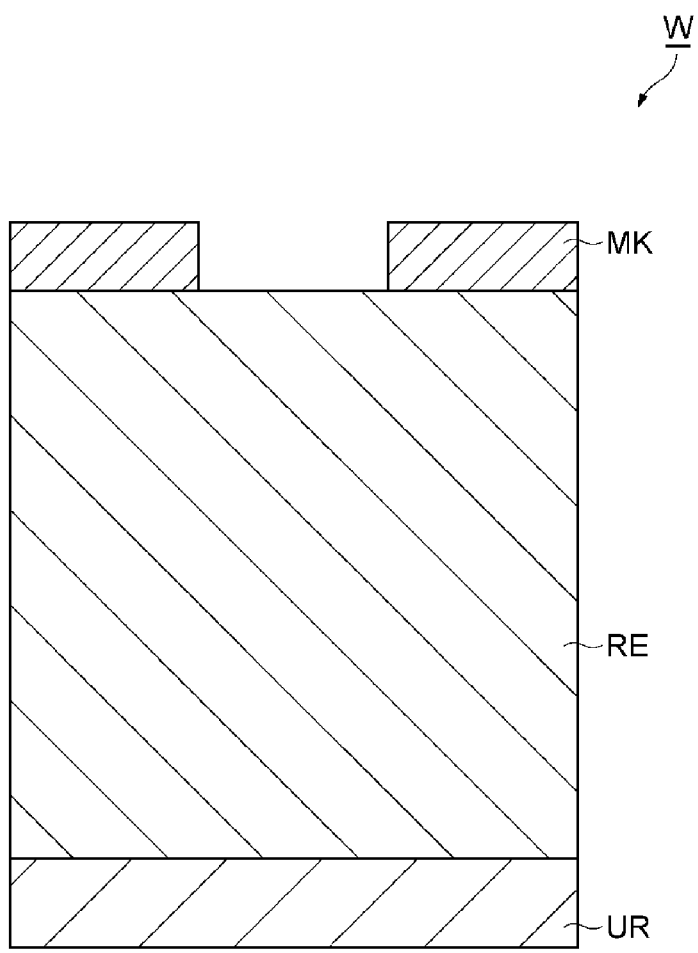
FIG. 2 is a partially enlarged cross-sectional view of an example substrate.

FIG. 1 is a flowchart of an etching method according to one embodiment. The etching method illustrated in FIG. 1 (hereinafter referred to as "method MT") is applied to a substrate. FIG. 2 is a partially enlarged cross-sectional view of an example substrate. The substrate W illustrated in FIG. 2 has a region RE. The region RE is a region to be etched. The substrate W further has a mask MK. The substrate W may further have an underlying region UR.

The region RE is provided on the underlying region UR. The mask MK is provided on the region RE. The mask MK is patterned. That is, the mask MK provides one or more openings. The substrate W has a sidewall surface and a bottom surface which define each of the one or more openings. In the substrate W illustrated in FIG. 2, the sidewall surface is provided by the mask MK, and the bottom surface is provided by the region RE. The region RE is partially exposed from the opening of the mask MK. The region RE may be formed of any material. The region RE is, for example, a silicon-containing layer or an organic layer. The region RE may be formed of a dielectric. The mask MK may be formed of any material as long as the region RE is selectively etched against the mask MK. The mask MK may be a hard mask or a mask formed of a photoresist. The mask MK formed of the photoresist may or may not contain a tin atom. The photoresist may be a photoresist for extreme ultraviolet light.

Hereinafter, some examples regarding the combination of the region RE and the mask MK will be illustrated.

In a first example of the substrate W, the region RE is an organic layer. In the first example of the substrate W, the mask MK is formed of a silicon-containing layer. The silicon-containing layer is, for example, an antireflection layer containing silicon.

In a second example of the substrate W, the region RE is a low dielectric constant layer, and contains silicon, carbon, oxygen, and hydrogen. That is, in the second example of the substrate W, the region RE is a SiCOH layer. In the second example of the substrate W, the mask MK is formed of a metal-containing layer such as a tungsten-containing layer and a titanium-containing layer. In the second example of the substrate W, the mask MK may be formed of an organic layer such as a photoresist layer, a silicon nitride layer, or a polycrystalline silicon layer.

In a third example of the substrate W, the region RE is a polycrystalline silicon layer. In the third example of the substrate W, the mask MK is formed of a metal-containing layer such as a tungsten-containing layer and a titanium-containing layer. In the third example of the substrate W, the mask MK may be formed of an organic layer such as a photoresist layer, a silicon oxide layer, or a silicon nitride layer.

In a fourth example of the substrate W, the region RE is a silicon-containing layer. The silicon-containing layer may be a silicon-containing dielectric layer. The silicon-containing layer may be a monolayer layer. The silicon-containing layer may be a multilayer in which at least one layer is formed of a silicon-containing dielectric. The silicon-containing layer is, for example, a silicon oxide layer, a silicon nitride layer, a multilayer including a silicon oxide layer and a silicon nitride layer which are alternately stacked, or a multilayer including a silicon oxide layer and a polycrystalline silicon layer which are alternately stacked. In the fourth example of the substrate W, the mask MK is formed of an organic layer, a metal-containing layer, or a polycrystalline silicon layer. The organic layer is, for example, an amorphous carbon layer, a spin-on carbon layer, or a photoresist layer. The metal-containing layer is formed of, for example, tungsten or tungsten carbide.

Figure 3:
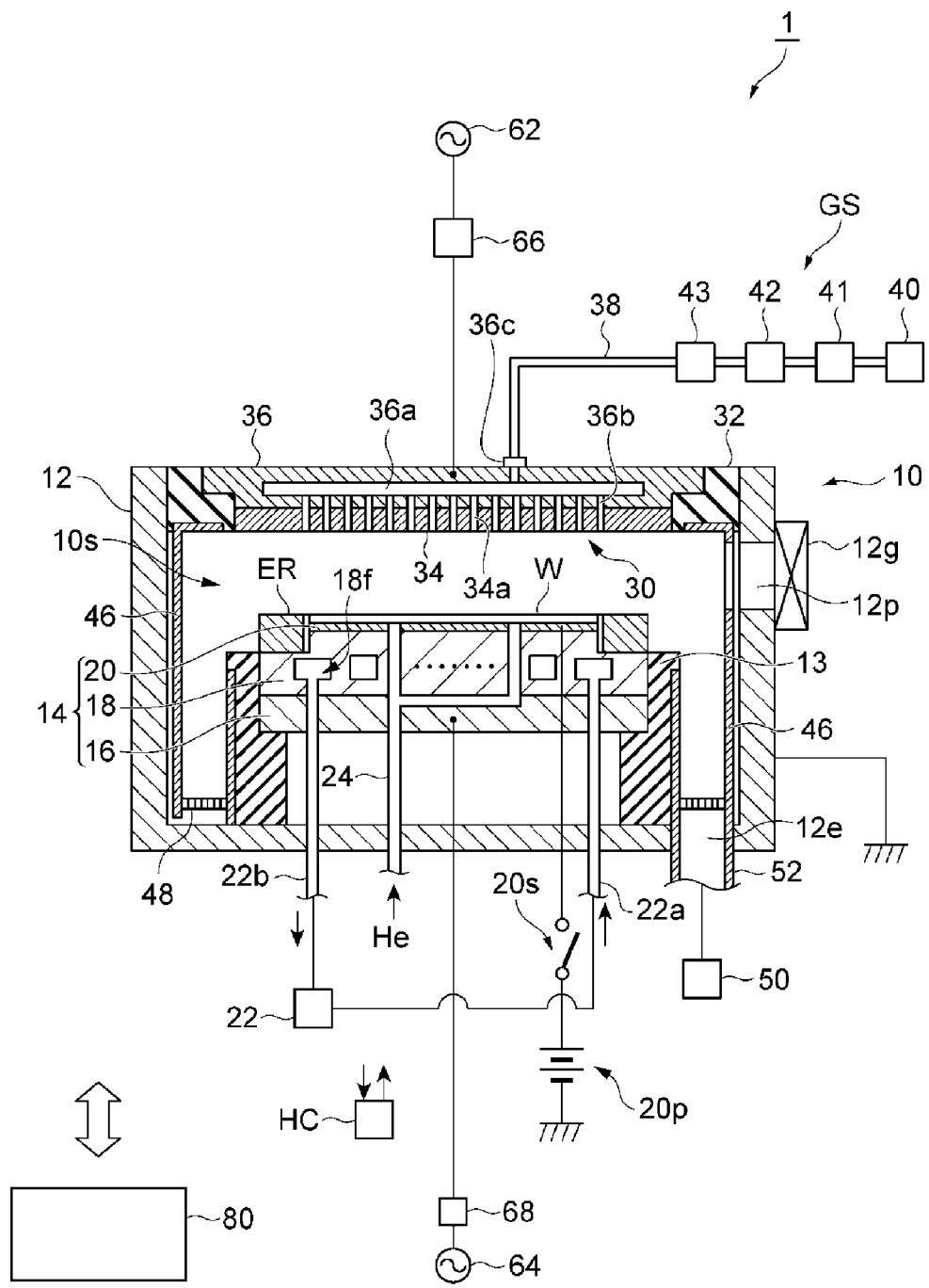
FIG. 3 is a diagram schematically illustrating a substrate processing apparatus according to one embodiment.

In one embodiment, the method MT is performed using a substrate processing apparatus. FIG. 3 is a diagram schematically illustrating a substrate processing apparatus according to one embodiment. The substrate processing apparatus illustrated in FIG. 3 is a capacitively coupled plasma processing apparatus 1.

The plasma processing apparatus 1 includes a chamber 10. The chamber 10 provides an internal space 10s therein. The chamber 10 may include a chamber body 12. The chamber body 12 has a substantially cylindrical shape. The internal space 10s is provided inside the chamber body 12. The chamber body 12 is formed of, for example, aluminum. A corrosion-resistant layer may be provided on the inner wall surface of the chamber body 12. The corrosion-resistant layer may be a layer formed of a ceramic such as aluminum oxide or yttrium oxide.

The sidewall of the chamber body 12 may provide a passage 12p. The substrate W passes through the passage 12p when being transported between the internal space 10s and the outside of the chamber 10. The passage 12p may be opened and closed by a gate valve 12g. The gate valve 12g is provided along the sidewall of the chamber body 12.

The plasma processing apparatus 1 further includes a substrate supporter 14. The substrate supporter 14 is configured to support the substrate W within the chamber 10, i.e., in the internal space 10s. The substrate supporter 14 may be supported by a support 13. The support 13 is formed of an insulating material. The support 13 has a substantially cylindrical shape. The support 13 extends upward from the bottom of the chamber body 12 in the internal space 10s.

The substrate supporter 14 may have a lower electrode 18 and an electrostatic chuck 20. The lower electrode 18 and the electrostatic chuck 20 are provided within the chamber 10. The substrate supporter 14 may further include an electrode plate 16. The electrode plate 16 is provided within the chamber 10. The electrode plate 16 is formed of, for example, a conductor such as aluminum and has a substantially disk shape. The lower electrode 18 is provided on the electrode plate 16. The lower electrode 18 is formed of, for example, a conductor such as aluminum and has a substantially disk shape. The lower electrode 18 is electrically connected to the electrode plate 16.

Figure 4:
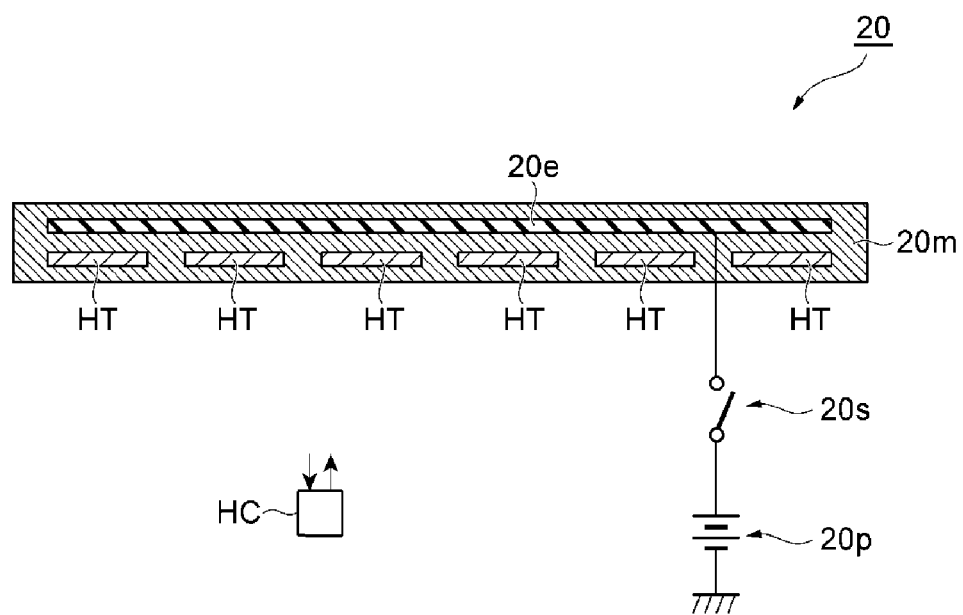
FIG. 4 is an enlarged cross-sectional view of an electrostatic chuck in the substrate processing apparatus according to one embodiment.

FIG. 4 is an enlarged cross-sectional view of the electrostatic chuck in the substrate processing apparatus according to one embodiment. Hereinafter, reference will be made to FIGS. 3 and 4. The electrostatic chuck 20 is provided on the lower electrode 18. The substrate W is placed on the upper surface of the electrostatic chuck 20. The electrostatic chuck 20 has a main body 20m and an electrode 20e. The main body 20m has a substantially disk shape and is formed of a dielectric. The electrode 20e is a film-shaped electrode and is provided within the main body 20m. The electrode 20e is connected to a DC power supply 20p via a switch 20s. When a voltage from the DC power supply 20p is applied to the electrode 20e, an electrostatic attraction is generated between the electrostatic chuck 20 and the substrate W. By the generated electrostatic attraction, the substrate W is attracted to the electrostatic chuck 20 and is held by the electrostatic chuck 20.

The substrate supporter 14 may have one or more heaters HT. Each of the one or more heaters HT may be a resistive heating element. The plasma processing apparatus 1 may further include a heater controller HC. Each of the one or more heaters HT generates heat according to the electric power individually given from the heater controller HC. As a result, the temperature of the substrate W on the substrate supporter 14 is adjusted. The one or more heaters HT constitute a temperature adjusting mechanism of the plasma processing apparatus 1. In one embodiment, the substrate supporter 14 has a plurality of heaters HT. The plurality of heaters HT are provided in the electrostatic chuck 20.

An edge ring ER is arranged on the peripheral edge of the substrate supporter 14. The substrate W is arranged on the electrostatic chuck 20 and in a region surrounded by the edge ring ER. The edge ring ER is used to improve the in-plane uniformity of a plasma processing with respect to the substrate W. The edge ring ER may be formed of, but not limited to, silicon, silicon carbide, or quartz.

The lower electrode 18 may provide a flow path 18f for a heat exchange medium (e.g., a coolant) therein. The heat exchange medium is supplied from a chiller unit 22 provided outside the chamber 10 to the flow path 18f via a pipe 22a. The heat exchange medium supplied to the flow path 18f is returned to the chiller unit 22 via a pipe 22b. In the plasma processing apparatus 1, the temperature of the substrate W placed on the electrostatic chuck 20 is adjusted by heat exchange between the heat exchange medium and the lower electrode 18. The chiller unit 22 may also constitute the temperature adjusting mechanism of the plasma processing apparatus 1.

The plasma processing apparatus 1 may provide a gas supply line 24. The gas supply line 24 supplies a heat transfer gas (e.g., He gas) from a heat transfer gas supply mechanism to a gap between the upper surface of the electrostatic chuck 20 and the back surface of the substrate W.

The plasma processing apparatus 1 further includes an upper electrode 30. The upper electrode 30 is provided above the substrate supporter 14. The upper electrode 30 is supported in the upper portion of the chamber body 12 via a member 32. The member 32 is formed of an insulating material. The upper electrode 30 and the member 32 close an upper opening of the chamber body 12.

The upper electrode 30 may include a top plate 34 and a support body 36. The lower surface of the top plate 34 is the lower surface on the side of the internal space 10s, and defines the internal space 10s. The top plate 34 may be formed of a low resistance conductor or semiconductor having low Joule heat. The top plate 34 provides a plurality of gas ejection holes 34a. The plurality of gas ejection holes 34a penetrate the top plate 34 in the plate thickness direction.

The support body 36 supports the top plate 34 in a detachable manner The support body 36 is formed of a conductive material such as aluminum. The support body 36 provides a gas diffusion chamber 36a therein. The support body 36 further provides a plurality of gas holes 36a. The plurality of gas holes 36b extend downward from the gas diffusion chamber 36a. The plurality of gas holes 36b communicate with the plurality of gas ejection holes 34a, respectively. The support body 36 further provides a gas introduction port 36c. The gas introduction port 36c is connected to the gas diffusion chamber 36a. A gas supply pipe 38 is connected to the gas introduction port 36c.

A gas source group 40 is connected to the gas supply pipe 38 via a valve group 41, a flow rate controller group 42, and a valve group 43. The gas source group 40, the valve group 41, the flow rate controller group 42, and the valve group 43 constitute a gas supply GS. The gas source group 40 includes a plurality of gas sources. The plurality of gas sources of the gas source group 40 include sources of a plurality of gases used in the method MT. When one or more gases used in the method MT are formed from a liquid, the plurality of gas sources include one or more gas sources each having a liquid source and a vaporizer. Each of the valve group 41 and the valve group 43 includes a plurality of opening and closing valves. The flow rate controller group 42 includes a plurality of flow rate controllers. Each of the plurality of flow rate controllers in the flow rate controller group 42 is a mass flow controller or a pressure-controlled flow rate controller. Each of the plurality of gas sources of the gas source group 40 is connected to the gas supply pipe 38 via a corresponding opening and closing valve of the valve group 41, a corresponding flow rate controller of the flow rate controller group 42, and a corresponding opening and closing valve of the valve group 43.

The plasma processing apparatus 1 may further include a shield 46. The shield 46 is detachably provided along the inner wall surface of the chamber body 12. The shield 46 is also provided on the outer periphery of the support 13. The shield 46 prevents etching by-products from adhering to the chamber body 12. The shield 46 is constructed, for example, by forming a corrosion-resistant layer on the surface of a member formed of aluminum. The corrosion-resistant layer may be a layer formed of a ceramic such as yttrium oxide.

The plasma processing apparatus 1 may further include a baffle plate 48. The baffle plate 48 is provided between the support 13 and the sidewall of the chamber body 12. The baffle plate 48 is constructed, for example, by forming a corrosion-resistant layer on the surface of a member formed of aluminum. The corrosion-resistant layer may be a layer formed of a ceramic such as yttrium oxide. A plurality of through-holes are formed in the baffle plate 48. An exhaust port 12e is provided below the baffle plate 48 and in the bottom of the chamber body 12. An exhaust device 50 is connected to the exhaust port 12e via an exhaust pipe 52. The exhaust device 50 has a pressure regulating valve and a vacuum pump such as a turbo molecular pump.

The plasma processing apparatus 1 further includes a first radio-frequency power supply 62 and a second radio-frequency power supply 64. The first radio-frequency power supply 62 is a power supply that generates first radio-frequency power. The first radio-frequency power has a frequency suitable for generating plasma. The frequency of the first radio-frequency power is, for example, a frequency in the range of 27 MHz to 100 MHz. The first radio-frequency power supply 62 is connected to the upper electrode 30 via a matcher 66. The matcher 66 has a circuit for matching the impedance of the load side (upper electrode 30 side) of the first radio-frequency power supply 62 with the output impedance of the first radio-frequency power supply 62. The first radio-frequency power supply 62 may be connected to the lower electrode 18 via the matcher 66. The first radio-frequency power supply 62 constitutes an example plasma generator.

The second radio-frequency power supply 64 is a power supply that generates second radio-frequency power. The second radio-frequency power has a frequency lower than the frequency of the first radio-frequency power. When the second radio-frequency power is used together with the first radio-frequency power, the second radio-frequency power is used as bias radio-frequency power for drawing ions into the substrate W. The frequency of the second radio-frequency power is, for example, a frequency in the range of 400 kHz to 13.56 MHz. The second radio-frequency power supply 64 is connected to the lower electrode 18 via a matcher 68 and the electrode plate 16. The matcher 68 has a circuit for matching the impedance of the load side (lower electrode 18 side) of the second radio-frequency power supply 64 with the output impedance of the second radio-frequency power supply 64.

Plasma may be generated using the second radio-frequency power without the first radio-frequency power, i.e., using only a single radio-frequency power. In this case, the frequency of the second radio-frequency power may be a frequency larger than 13.56 MHz, for example, 40 MHz. In this case, the plasma processing apparatus 1 may not include the first radio-frequency power supply 62 and the matcher 66. In this case, the second radio-frequency power supply 64 constitutes an example plasma generator.

When plasma is generated in the plasma processing apparatus 1, a gas is supplied from the gas supply GS to the internal space 10s. Further, by supplying the first radio-frequency power and/or the second radio-frequency power, a radio-frequency electric field is generated between the upper electrode 30 and the lower electrode 18. The generated radio-frequency electric field excites the gas. As a result, plasma is generated.

The plasma processing apparatus 1 may further include a controller 80. The controller 80 may be a computer including a processor, a storage unit such as a memory, an input device, a display device, and a signal input/output interface. The controller 80 controls each component of the plasma processing apparatus 1. The controller 80 may allow an operator to perform an input operation of a command in order to manage the plasma processing apparatus 1 using an input device. Further, the controller 80 may visualize and display an operating status of the plasma processing apparatus 1 by a display device. Further, a control program and recipe data are stored in the storage unit of the controller 80. The control program is performed by the processor of the controller 80 in order to perform various processings in the plasma processing apparatus 1. The method MT is performed in the plasma processing apparatus 1 as the processor of the controller 80 executes the control program and controls each component of the plasma processing apparatus 1 according to the recipe data.

The method MT will again be described in detail with reference to FIG. 1. In the following description, the method MT will be described by taking as an example a case where the substrate W illustrated in FIG. 2 is processed using the plasma processing apparatus 1. In the method MT, another substrate processing apparatus may be used. In the method MT, other substrates may be processed.

The method MT is performed in a state where the substrate W is placed on the substrate supporter 14. The method MT may be performed while maintaining a decompressed environment in the internal space 10s of the chamber 10 and without removing the substrate W from the internal space 10s. In one embodiment, the method MT may be initiated in step STa. In step STa, the region RE is etched. The region RE may be etched using plasma.

In step STa, plasma Pa is generated from a processing gas within the chamber 10. When the first example of the substrate W described above is processed, i.e., when the region RE of the substrate W is an organic layer, the processing gas used in step STa may include an oxygen-containing gas. The oxygen-containing gas includes, for example, oxygen gas, carbon monoxide gas, or carbon dioxide gas. Alternatively, when the first example of the substrate W is processed, the processing gas used in step STa may include nitrogen gas and/or hydrogen gas.

When the second example of the substrate W described above is processed, i.e., when the region RE of the substrate W is a low dielectric constant layer, the processing gas used in step STa may include a fluorine-containing gas. The fluorine-containing gas is, for example, a fluorocarbon gas. The fluorocarbon gas is, for example, a $C_4F_8$ gas.

When the third example of the substrate W described above is processed, i.e., when the region RE of the substrate W is a polycrystalline silicon layer, the processing gas used in step STa may include a halogen-containing gas. The halogen-containing gas is, for example, HBr gas, $Cl_2$ gas, or $SF_6$ gas.

When the region RE is a silicon oxide layer in the fourth example of the substrate W described above, the processing gas used in step STa may include a fluorocarbon gas. When the region RE is a silicon nitride layer in the fourth example of the substrate W, the processing gas used in step STa may include a hydrofluorocarbon gas. When the region RE is a multilayer including a silicon oxide layer and a silicon nitride layer which are alternately stacked in the fourth example of the substrate W, the processing gas used in step STa may include a fluorocarbon gas and a hydrofluorocarbon gas. When the region RE is a multilayer including a silicon oxide layer and a polycrystalline silicon layer which are alternately stacked in the fourth example of the substrate W, the processing gas used in step STa may include a fluorocarbon gas and a halogen-containing gas. The fluorocarbon gas is, for example, $CF_4$ gas, $C_4F_6$ gas, or $C_4F_8$ gas. The hydrofluorocarbon gas is, for example, $CH_3F$ gas. The halogen-containing gas is, for example, HBr gas or $Cl_2$ gas.

Figure 5A:
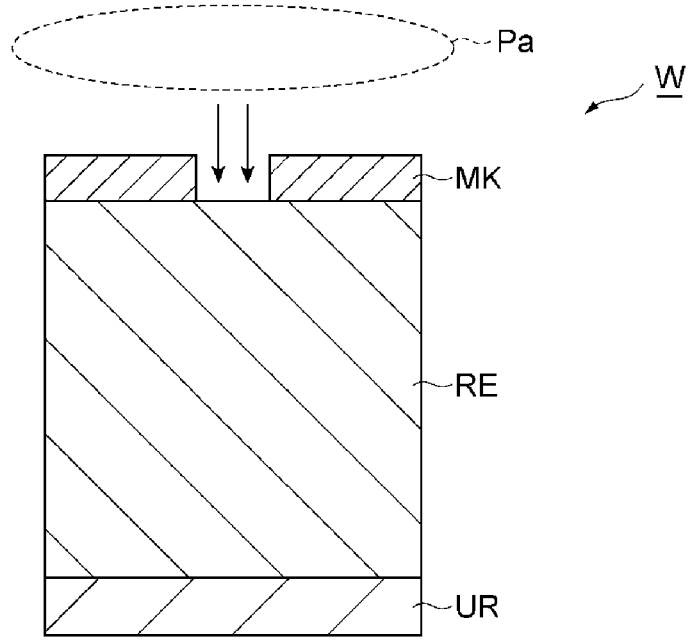
FIG. 5A is a diagram for explaining an example of step STa of the etching method illustrated in FIG. 1.
Figure 5B:
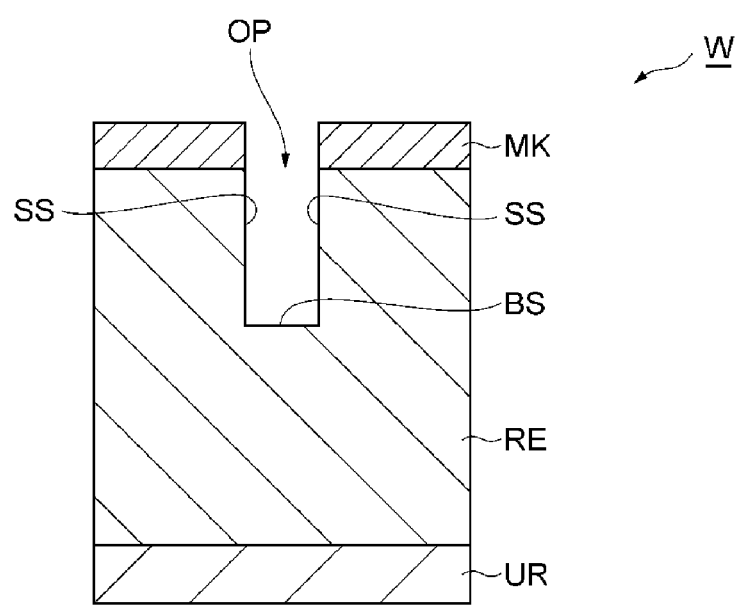
FIG. 5B is a partially enlarged cross-sectional view of an example substrate in a state after step STa is performed.

FIG. 5A is a diagram for explaining an example of step STa of the etching method illustrated in FIG. 1, and FIG. 5B is a partially enlarged cross-sectional view of an example substrate in a state after step STa is performed. In step STa, as illustrated in FIG. 5A, chemical species from the plasma Pa are supplied to the region RE, and the region RE is etched by the chemical species. In step STa, the region RE is etched to a position between the lower surface of the region RE and the upper surface of the region RE. This position is determined so that etching of the region RE in the lateral direction does not substantially occur even if the region RE is etched to that position in step STa. The lower surface of the region RE is the surface of the region RE that comes into contact with the underlying region UR. The upper surface of the region RE is the surface of the region RE exposed from the opening of the mask MK. When step STa is performed, as illustrated in FIG. 5B, an opening OP continuous from the mask MK is formed in the region RE. The opening OP is defined by a sidewall surface SS and a bottom surface BS. The sidewall surface SS is provided by the mask MK and the region RE. The bottom surface BS is provided by the region RE. The mask MK may be thinned after step STa is performed.

In step STa, the controller 80 controls the gas supply GS so as to supply a processing gas into the chamber 10. In step STa, the controller 80 controls the exhaust device 50 so as to set the pressure of the gas within the chamber 10 to a designated pressure. In step STa, the controller 80 controls the plasma generator in order to generate plasma from the processing gas. In step STa in one embodiment, the controller 80 controls the first radio-frequency power supply 62 and/or the second radio-frequency power supply 64 so as to supply the first radio-frequency power and/or the second radio-frequency power.

The method MT may not include step STa. In this case, the opening OP is provided in advance in the region RE of the substrate to which the method MT is applied. Alternatively, when the method MT does not include step STa, step ST1 and step ST2 are applied to the substrate W illustrated in FIG. 2.

In step ST1, a protective layer PF is formed on the surface of the substrate W. The protective layer PF contains a tin (Sn) atom. The protective layer PF is, for example, a layer containing metallic tin as a main component, a layer containing a tin oxide ($SnO_x$) as a main component, a layer containing a tin hydroxide ($Sn(OH)_x$), a layer containing a tin nitride ($Sn_xN_y$) as a main component, a layer containing a tin sulfide ($SnS_x$) as a main component, or a layer containing a tin halide as a main component. Here, each of "x" and "y" is an integer of 1 or more. The tin oxide is, for example, $SnO_2$ or SnO. The tin hydroxide is, for example, $Sn(OH)_2$ or $Sn(OH)_4$. The tin nitride is, for example, SnN or $Sn_3N_4$. The tin sulfide is, for example, SnS or $SnS_2$. The tin halide is, for example, $SnF_4$, $SnCl_2$, $SnBr_2$ or $SnI_2$. Further, compounds constituting these protective layers may be combined and/or mixed in any ratio.

Figure 6:
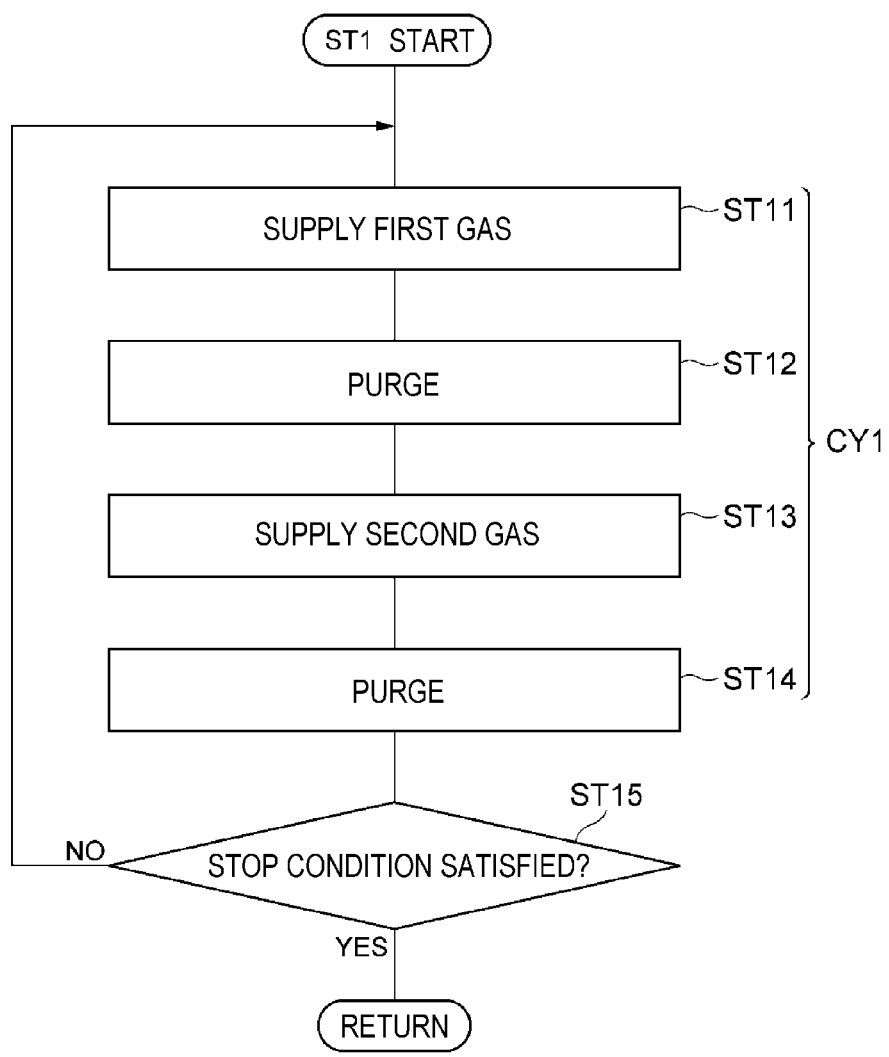
FIG. 6 is a flowchart of a layer forming method which may be used in an etching method according to one embodiment.

In one embodiment, step ST1 may be formed by a layer forming method illustrated in the flowchart of FIG. 6. FIG. 6 is a flowchart of a layer forming method which may be used in an etching method according to one embodiment.

In one embodiment, step ST1 includes step ST11 and step ST13. Step ST1 may further include step ST12 and step ST14. Step ST12 is performed between step ST11 and step ST13. Step ST14 is performed between step ST13 and step ST11.

In step ST11, the first gas is supplied to the substrate W. That is, in step ST11, the first gas is supplied into the chamber 10. In step ST11, plasma may be generated from the first gas within chamber 10. Alternatively, in step ST11, no plasma may be generated from the first gas. In step ST11, the controller 80 controls the gas supply GS so as to supply the first gas into the chamber 10. In step ST11, the controller 80 controls the exhaust device 50 so as to set the pressure of the gas within the chamber 10 to a designated pressure. When the plasma is generated in step ST11, the controller 80 controls the plasma generator so as to generate the plasma from the first gas within the chamber 10. In one embodiment, in order to generate the plasma from the first gas, the controller 80 controls the first radio-frequency power supply 62 and/or the second radio-frequency power supply 64 so as to supply the first radio-frequency power and/or the second radio-frequency power.

In step ST12, purging of the internal space 10s is performed. In step ST12, the controller 80 controls the exhaust device 50 so as to exhaust the internal space 10s. In step ST12, the controller 80 may control the gas supply GS so as to supply an inert gas into the chamber 10. By performing step ST12, the first gas within the chamber 10 may be replaced with the inert gas. By performing step ST12, an excessive substance adsorbed on the substrate W may be removed.

In step ST13, the second gas is supplied to the substrate W. That is, in step ST13, the second gas is supplied into the chamber 10. In step ST13, plasma may be generated from the second gas within chamber 10. Alternatively, in step ST13, no plasma may be generated from the second gas. In step ST13, the controller 80 controls the gas supply GS so as to supply the second gas into the chamber 10. In step ST13, the controller 80 controls the exhaust device 50 so as to set the pressure of the gas within the chamber 10 to a designated pressure. When the plasma is generated in step ST13, the controller 80 controls the plasma generator so as to generate the plasma from the second gas within the chamber 10. In one embodiment, in order to generate the plasma from the second gas, the controller 80 controls the first radio-frequency power supply 62 and/or the second radio-frequency power supply 64 so as to supply the first radio-frequency power and/or the second radio-frequency power. With step ST11 and step ST13, the protective layer PF is formed on the surface of the substrate W.

In step ST14, purging of the internal space 10s is performed. Step ST14 is the same as step ST12. By performing step ST14, the second gas within the chamber 10 may be replaced with the inert gas.

In step ST1, a plurality of layer forming cycles CY1 each including step ST11 and step ST13 may be sequentially repeated. Each of the plurality of layer forming cycles CY1 may further include step ST12 and step ST14. The thickness of the protective layer PF may be adjusted by the number of repetitions of the layer forming cycle CY1. When the layer forming cycle CY1 is repeated, it is determined in step ST15 whether or not a stop condition is satisfied. The stop condition is satisfied when the number of times the layer forming cycle CY1 is performed reaches a predetermined number of times. When it is determined in step ST15 that the stop condition is not satisfied, the layer forming cycle CY1 is performed again. When it is determined in step ST15 that the stop condition is satisfied, the performance of step ST1 is completed and the processing proceeds to step ST2.

In one embodiment, at least one of the first gas and the second gas contains a tin-containing substance. The other of the first gas and the second gas may contain $H_2O$, $H_2O_2$, $O_2$, $O_3$, $N_2O_4$, a nitrogen-containing inorganic compound, a sulfur-containing inorganic compound, a halogen compound, a carbon-containing substance, a silicon-containing substance, or a tin-containing substance. In this case, the other of the first gas and the second gas may be used without generating the plasma, or the plasma may be generated from the other of the first gas and the second gas. Alternatively, the other of the first gas and the second gas may contain at least one of $N_2$ and an oxygen-containing substance. In this case, chemical species from the plasma generated from the other of the first gas and the second gas may be supplied to a precursor layer containing a tin atom formed on the surface of the substrate W. Alternatively, at least one of the first gas and the second gas may be supplied to the precursor layer containing a tin atom and formed on the surface of the substrate W without generating the plasma therefrom. The oxygen-containing substance may be NO or $CO_2$.

The tin-containing substance is, for example, a stannane compound, an oxygen-containing tin compound, a nitrogen-containing tin compound, or a tin halide compound.

The stannane compound is, for example, stannane, tetramethylstannan, tributylstannan, phenyltrimethylstannan, tetravinylstannan, dimethyldichlorostannan, butyltrichlorostannan, or trichlorophenylstannan.

The oxygen-containing tin compound is, for example, tributyltin methoxide, tin tert-butoxide, dibutyltin diacetate, triphenyltin acetate, tributyltin oxide, triphenyltin acetate, triphenyltin hydroxide, butylchlorotin dihydroxide, or acetylacetonatotin.

The nitrogen-containing tin compound is, for example, dimethylaminotrimethyltin, tris(dimethylamino) tert-butyltin, azidetrimethyltin, tetrakis(dimethylamino)tin, N,N'-di-tert-butyl-2,3-diamidobutane tin(II).

The tin halide compound is, for example, tin chloride, tin bromide, tin iodide, dimethyltin dichloride, butyltin trichloride, or phenyltin trichloride. The tin halide compound may be tetravalent tin chloride, tin bromide, or tin iodide. The tetravalent tin chloride, tin bromide, and tin iodide have low melting points, and therefore may be used to form a precursor layer from which the protective layer PF is formed. Meanwhile, tetravalent tin fluoride and divalent tin halide have a high melting point, and therefore may be used as a material constituting the protective layer PF.

The nitrogen-containing inorganic compound which may be included in the other of the first gas and the second gas is, for example, $NH_3$ or $N_2O_4$. The sulfur-containing inorganic compound which may be included in the other of the first gas and the second gas is, for example, $H_2S$, $SO_2$, COS or $CS_2$. The halogen compound which may be included in the other of the first gas and the second gas is, for example, $CF_4$, $F_2$ or $CCl_4$. A carbon-containing material which may be included in the other of the first gas and the second gas is hydrocarbon, fluorocarbon, an organic compound having a hydroxyl group, carboxylic acid, carboxylic anhydride, or carboxylic acid halide. The hydrocarbon is, for example, methane or propylene. The fluorocarbon is, for example, $CF_4$ or $C_4F_6$. The organic compound having a hydroxyl group is, for example, alcohols such as methanol and ethylene glycol or phenols. The carboxylic acid is, for example, acetic acid or oxalic acid. The silicon-containing substance which may be included in the other of the first gas and the second gas is, for example, silicon chloride or aminosilane.

Figure 7A:
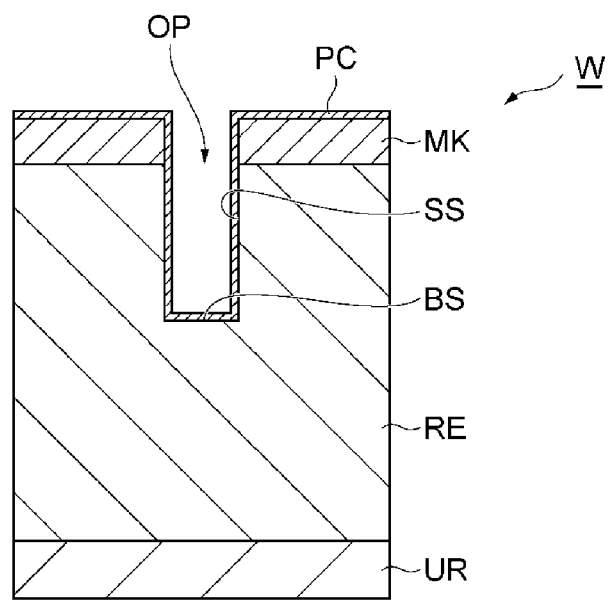
FIG. 7A is a partially enlarged cross-sectional view of an example substrate in a state after a precursor layer is formed.
Figure 7B:
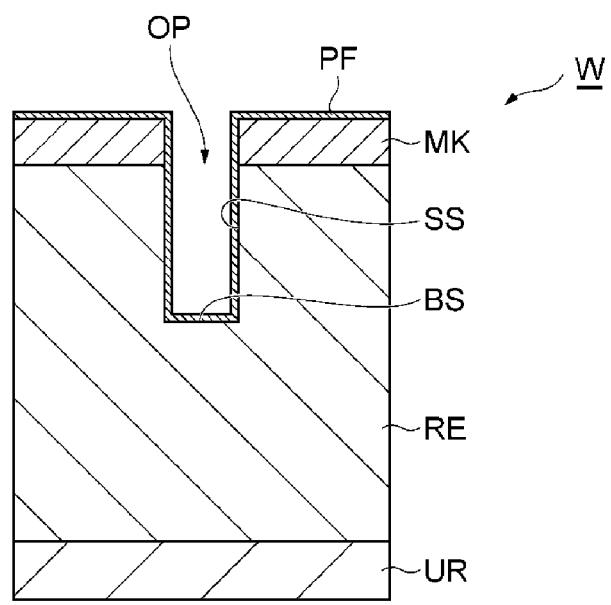
FIG. 7B is a partially enlarged cross-sectional view of the example substrate after a protective layer is formed.

Hereinafter, reference will be made to FIGS. 7A and 7B together with FIG. 6. FIG. 7A is a partially enlarged cross-sectional view of an example substrate in a state after a precursor layer is formed. FIG. 7B is a partially enlarged cross-sectional view of the example substrate in a state after a protective layer is formed. In one embodiment, in step ST11, a precursor layer PC may be formed on the surface of the substrate W using the first gas. In this embodiment, the first gas includes the tin-containing material described above. The first gas may further contain a carrier gas. The carrier gas is an inert gas. The inert gas is, for example, a noble gas or a nitrogen gas. In step ST11, as illustrated in FIG. 7A, the precursor layer PC is formed on the substrate W from the substance contained in the first gas. By performing step ST11 and step ST12, the precursor layer PC may be formed as a monomolecular layer on the substrate W.

In one embodiment, in step ST13, the protective layer PF may be formed from the precursor layer PC, as illustrated in FIG. 7B. In step ST13, the second gas is used for the formation of the protective layer PF. The second gas contains reaction species which form the protective layer PF from the precursor layer PC by reacting with a substance constituting the precursor layer PC. The second gas may further contain a carrier gas. The carrier gas is an inert gas. In step ST13, the protective layer PF may be formed by oxidizing, nitriding, sulfurizing, reducing, or halogenating the precursor layer PC using the second gas. The second gas for oxidizing the precursor layer PC contains, for example, at least one of $H_2O$, $H_2O_2$, $O_3$, $O_2$, and $N_2O_4$. The second gas for nitriding the precursor layer PC contains, for example, at least one of the above-described nitrogen-containing inorganic compound, $N_2$, and $N_2O_4$. The second gas for sulfurizing the precursor layer PC contains, for example, the above-described sulfur-containing inorganic compound. The second gas for reducing the precursor layer PC contains, for example, CO or 1,4-bis(trimethylsilyl)-1,4-dihydropyrazine. The second gas for halogenating the precursor layer PC contains, for example, the above-described halogen compound.

Reference will again be made to FIG. 1. In one embodiment, step ST2 is performed after step ST1 as illustrated in FIG. 1. The method MT may further include generating plasma from a processing gas and etching the protective layer PF on the bottom surface BS before step ST2 (breakthrough step). The processing gas used in the breakthrough step may include a hydrogen-containing gas. The hydrogen-containing gas includes at least one of $H_2$, hydrocarbons, and hydrogen halide. The hydrocarbon is, for example, $CH_4$. The hydrogen halide is, for example, HBr. The processing gas used in the breakthrough step may further contain a noble gas (e.g., Ar gas).

In step ST2, the region RE is etched. In one embodiment, the region RE is etched by chemical species from plasma. In step ST2, plasma P2 is generated from the processing gas within the chamber 10. The processing gas used in step ST2 for the above-described each example processing of the substrate W may be the same as the processing gas used in step STa.

Figure 8A:
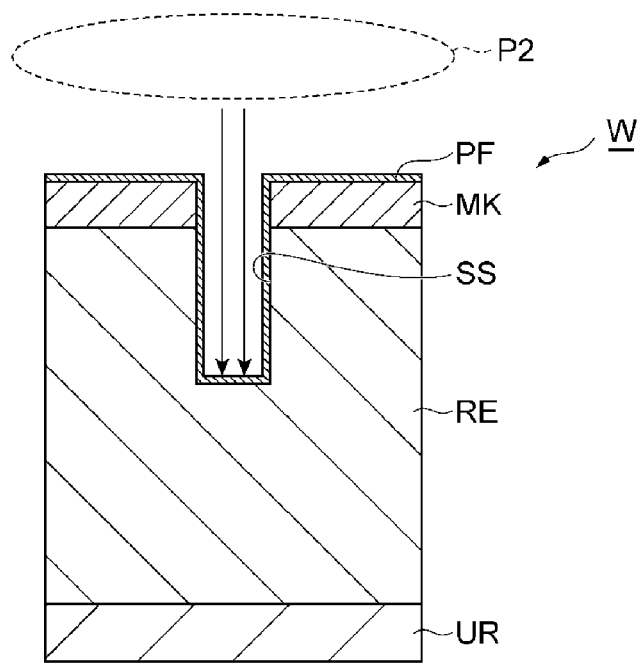
FIG. 8A is a diagram for explaining an example of step ST2 of the etching method illustrated in FIG. 1.
Figure 8B:
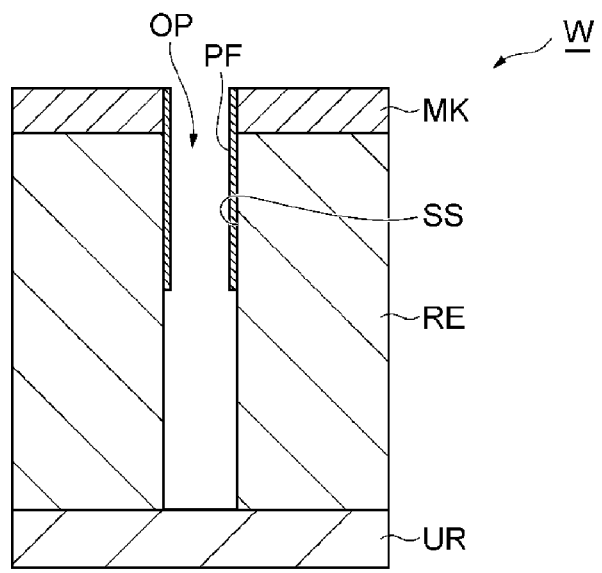
FIG. 8B is a partially enlarged cross-sectional view of an example substrate in a state after step ST2 is performed.

FIG. 8A is a diagram for explaining an example of step ST2 of the etching method illustrated in FIG. 1, and FIG. 8B is a partially enlarged cross-sectional view of an example substrate in a state after step ST2 is performed. In step ST2, as illustrated in FIG. 8A, the region RE is irradiated with chemical species from the plasma P2 and is etched by the chemical species. As a result of performing step ST2, the depth of the opening OP increases as illustrated in FIG. 8B.

In step ST2, the controller 80 controls the gas supply GS so as to supply a processing gas into the chamber 10. In step ST2, the controller 80 controls the exhaust device 50 so as to set the pressure of the gas within the chamber 10 to a designated pressure. In step ST2, the controller 80 controls the plasma generator in order to generate plasma from the processing gas. In step ST2 in one embodiment, the controller 80 controls the first radio-frequency power supply 62 and/or the second radio-frequency power supply 64 so as to supply the first radio-frequency power and/or the second radio-frequency power.

In the method MT, a plurality of layer forming cycles CY each including step ST1 and step ST2 may be sequentially performed. When the plurality of cycles CY are sequentially performed, it is determined in step ST3 whether or not a stop condition is satisfied. The stop condition is satisfied when the number of times the cycle CY is performed reaches a predetermined number of times. When it is determined in step ST3 that the stop condition is not satisfied, the cycle CY is performed again. When it is determined in step ST3 that the stop condition is satisfied, then step ST4 may be performed.

In step ST4, the protective layer PF is removed. In step ST4, the protective layer PF is etched using a removal gas. In step ST4, the protective layer may be etched with chemical species from plasma generated from the removal gas. Alternatively, the protective layer may be etched using the removal gas without generating the plasma. The removal gas may include a hydrogen-containing gas. The hydrogen-containing gas includes at least one of $H_2$, hydrocarbons, and hydrogen halide. The hydrocarbon is, for example, $CH_4$. The hydrogen halide is, for example, HBr. The removal gas may further contain a noble gas (e.g., Ar gas). The removal gas may include a halogen gas such as $Cl_2$.

In step ST4, the controller 80 controls the gas supply GS so as to supply a processing gas into the chamber 10. In step ST4, the controller 80 controls the exhaust device 50 so as to set the pressure of the gas within the chamber 10 to a designated pressure. In step ST4, the controller 80 controls the plasma generator in order to generate plasma from the processing gas. In step ST4 in one embodiment, the controller 80 controls the first radio-frequency power supply 62 and/or the second radio-frequency power supply 64 so as to supply the first radio-frequency power and/or the second radio-frequency power.

As described above, in the method MT, the protective layer PF containing tin (Sn) is formed on the surface of the substrate. Further, in the method MT, the region RE in the substrate W is etched. Accordingly, according to the method MT, it is possible to etch the region RE in a state where the sidewall surface SS provided by the surface of the mask MK and/or the region RE is protected. Hence, according to the method MT, it is possible to increase the etching selectivity of the region RE with respect to the etching of the mask MK. Further, according to the method MT, it is possible to adjust the dimension of the mask MK by the protective layer PF. Further, according to the method MT, it is possible to correct the shape of the mask MK by the protective layer PF. Further, according to the method MT, it is possible to protect the sidewall surface SS during etching of the region RE. The protective layer PF contains a tin atom, and therefore, has higher etching resistance than an organic layer and a silicon-containing layer. Further, the protective layer PF is easier to be removed than protective layers containing other metals. The protective layer PF may be easily removed using, for example, plasma of a hydrogen-containing gas. Accordingly, the protective layer PF is unlikely to be a source of contamination within the chamber 10.

In one embodiment, the condition of step ST1 for forming the protective layer PF in at least one cycle among the plurality of cycles CY may be different from the condition of step ST1 for forming the protective layer PF in at least another cycle among the plurality of cycles CY. The conditions of step ST1 of all of the cycles CY may be different from each other. In this case, the protective layer PF may be formed in each cycle so that the thickness or coverage thereof is different from the thickness or coverage of the protective layer PF formed in the other cycles.

In one embodiment, the condition of step ST2 in at least one cycle among the plurality of cycles CY may be different from the condition of step ST2 in at least another cycle among the plurality of cycles CY. The conditions of step ST2 of all of the cycles CY may be different from each other. In this case, the region RE is etched in each cycle so that the etching amount thereof is different from the etching amount of the region RE in the other cycles.

In one embodiment, in each of the plurality of cycles CY, the condition for forming the protective layer PF in one layer forming cycle among the plurality of layer forming cycles CY1 may be different from the condition for forming the protective layer PF in at least another layer forming cycle among the plurality of layer forming cycles CY1. That is, in each of the plurality of cycles CY, the condition of step ST11 and/or the condition of step ST13 in one layer forming cycle CY may be different from the condition of step ST11 and/or the condition of step ST13 in at least another layer forming cycle. In each of the plurality of cycles CY, the conditions for forming the protective layer PF in all of the layer forming cycles CY1 may be different from each other. In this case, the thickness distribution of the protective layer PF may be controlled in each of the plurality of layer forming cycles CY1 included in each of the plurality of cycles CY.

Figure 9A:
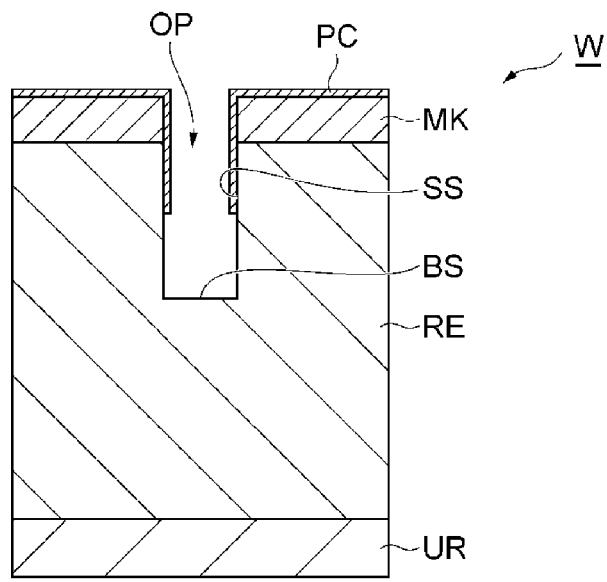
FIG. 9A is a partially enlarged cross-sectional view of an example substrate in a state after a precursor layer is formed.
Figure 9B:
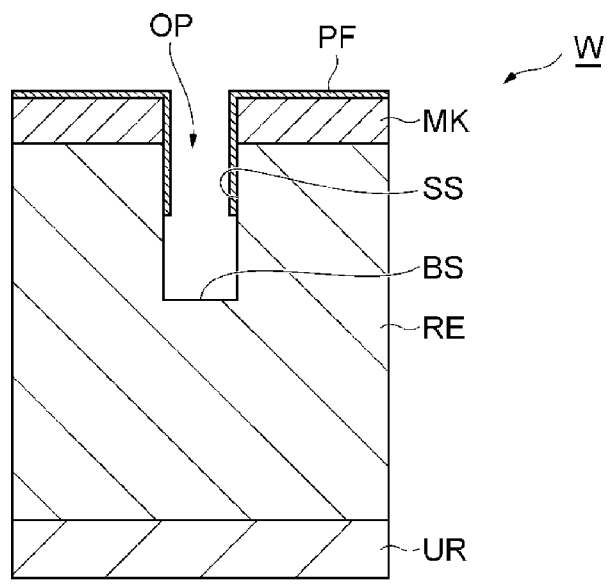
FIG. 9B is a partially enlarged cross-sectional view of the example substrate after a protective layer is formed.

Hereinafter, reference will be made to FIGS. 9A and 9B. FIG. 9A is a partially enlarged cross-sectional view of an example substrate in a state after a precursor layer is formed, and FIG. 9B is a partially enlarged cross-sectional view of the example substrate after a protective layer is formed. As illustrated in FIG. 9B, the protective layer PF may need only to cover a part of the sidewall surface SS which may be etched in the lateral direction when there is no protective layer PF, but may not need to cover the entire surface of the substrate W. For example, the protective layer PF may not need to cover the bottom surface BS. Alternatively, the thickness of the protective layer PF may vary according to the position thereof in the depth direction within the opening OP. That is, the thickness of the protective layer PF may have a distribution that varies according to the position thereof in the depth direction within the opening OP. For example, the thickness of the protective layer PF may be large near the upper end of the opening OP and small or zero near the deep part of the opening OP. The protective layer PF having such a thickness distribution may be formed by a forming processing of the protective layer PF or a chemical vapor deposition method (CVD method) described below with reference to FIGS. 9A and 9B.

In order to form the protective layer PF illustrated in FIG. 9B, in step ST11, the precursor layer PC may be formed to cover a part of the sidewall surface SS, but not to cover the entire surface of the substrate W, as illustrated in FIG. 9A. In order to form the precursor layer PC in this way, at least one of conditions (1) to (5) is satisfied in step ST11. Under the condition (1), the pressure of the gas in the chamber 10 during performance of step ST11 is set to be lower than the pressure at which the substance forming the precursor layer PC is adsorbed on the entire surface of the substrate W when the other processing conditions are the same. Under the condition (2), the processing time of step ST11 is set to be shorter than the processing time in which the substance forming the precursor layer PC is adsorbed on the entire surface of the substrate W when the other processing conditions are the same. Under the condition (3), the dilution degree of the substance forming the precursor layer PC in the first gas is set to a value higher than the dilution degree at which the substance forming the precursor layer PC is adsorbed on the entire surface of the substrate W when the other processing conditions are the same. Under the condition (4), the temperature of the substrate supporter 14 during performance of step ST11 is set to be lower than the temperature at which the substance forming the precursor layer PC is adsorbed on the entire surface of the substrate W when the other processing conditions are the same. The condition (5) may be applied when plasma is generated in step ST11. Under the condition (5), the absolute value of radio-frequency power (the first radio-frequency power and/or the second radio-frequency power) is set to be smaller than the absolute value at which the substance forming the precursor layer PC is adsorbed on the entire surface of the substrate W when the other processing conditions are the same.

In order to form the protective layer PF illustrated in FIG. 9B, at least one of the conditions (1) to (5) may be satisfied in step ST13. Under the condition (1), the pressure of the gas in the chamber 10 during performance of step ST13 is set to be lower than the pressure at which a reaction between the substance in the second gas and the substance forming the precursor layer PC is completed in the entire precursor layer PC when the other processing conditions are the same. Under the condition (2), the processing time of step ST13 is set to be shorter than the processing time in which a reaction between the substance in the second gas and the substance forming the precursor layer PC is completed in the entire precursor layer PC when the other processing conditions are the same. Under the condition (3), the dilution degree of the substance forming the protective layer PF in the second gas is set to a value higher than the dilution degree at which a reaction between the substance in the second gas and the substance forming the precursor layer PC is completed in the entire precursor layer PC when the other processing conditions are the same. Under the condition (4), the temperature of the substrate supporter 14 during performance of step ST13 is set to be lower than the temperature at which a reaction between the substance in the second gas and the substance forming the precursor layer PC is completed in the entire precursor layer PC when the other processing conditions are the same. The condition (5) may be applied when plasma is generated in step ST13. Under the condition (5), the absolute value of radio-frequency power (the first radio-frequency power and/or the second radio-frequency power) is set to be smaller than the absolute value at which a reaction between the substance in the second gas and the substance forming the precursor layer PC is completed in the entire precursor layer PC when the other processing conditions are the same.

In another embodiment, a chemical vapor deposition method (CVD method) may be used as the layer forming method in step ST1 of the method MT. The CVD method used in step ST1 may be a plasma CVD method or a thermal CVD method. When the CVD method is used as the layer forming method of step ST1, a layer forming gas supplied to the chamber 10 contains the above-described tin-containing substance. The layer forming gas may further contain an additive gas. As described above in relation to the first gas and the second gas, the additive gas may include at least one of a nitrogen-containing inorganic compound, a sulfur-containing inorganic compound, a halogen compound, a carbon-containing substance, a silicon-containing substance, $N_2$, $H_2O$, $H_2O_2$, $O_2$, $O_3$, $N_2O_4$, an oxygen-containing substance, and a noble gas.

Figure 10:
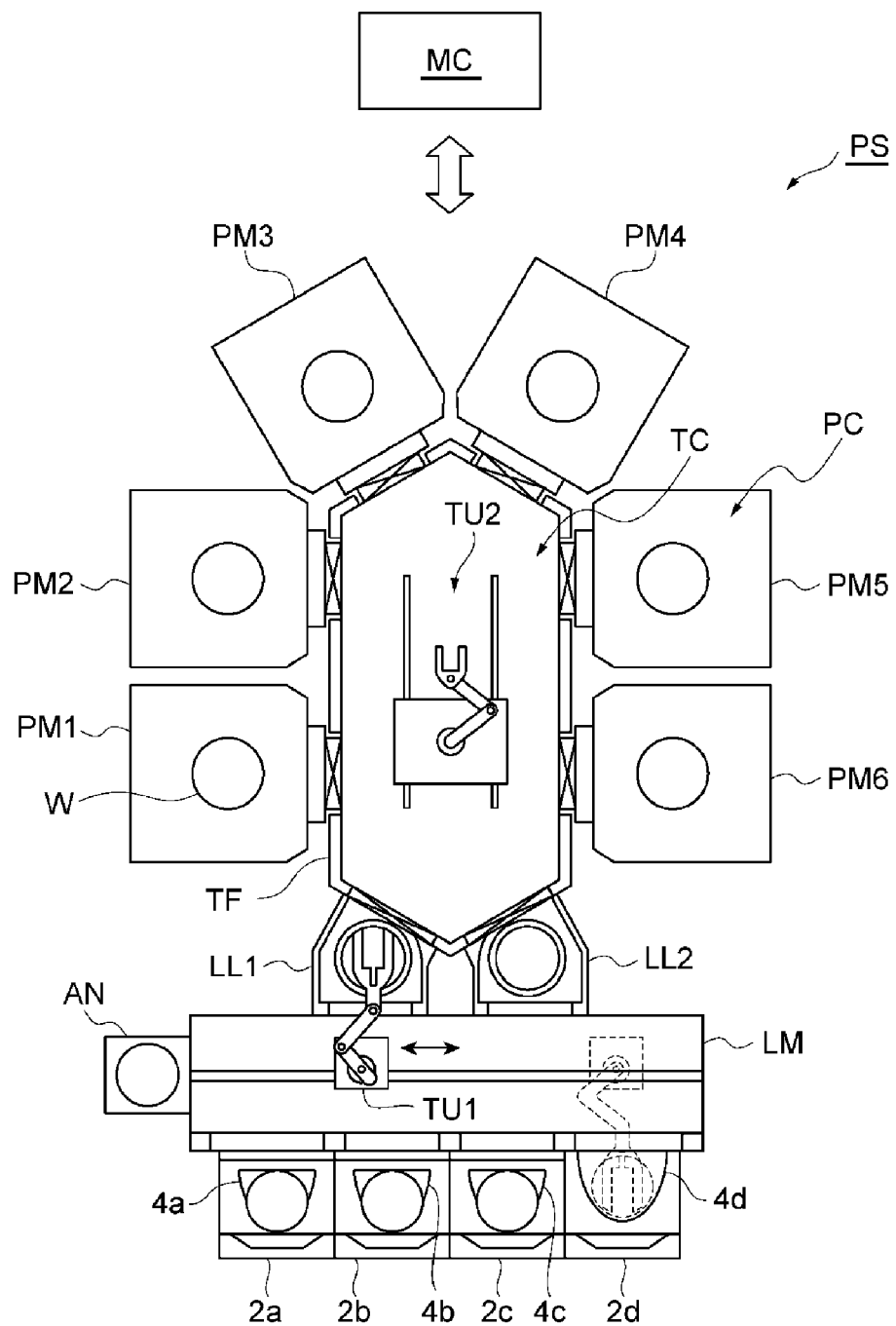
FIG. 10 is a diagram illustrating a substrate processing system according to one embodiment.

Reference will be made to FIG. 10. The method MT may be performed using a substrate processing system which includes a layer forming apparatus and a plasma processing apparatus. FIG. 10 is a diagram illustrating a substrate processing system according to one embodiment. The substrate processing system PS illustrated in FIG. 10 may be used to perform the method MT.

The substrate processing system PS includes tables 2a to 2d, containers 4a to 4d, a loader module LM, an aligner AN, load lock modules LL1 and LL2, process modules PM1 to PM6, a transport module TF, and a controller MC. The number of tables, the number of containers, and the number of load lock modules in the substrate processing system PS may be any number of one or more. Further, the number of process modules in the substrate processing system PS may be any number of two or more.

The tables 2a to 2d are arranged along one edge of the loader module LM. The containers 4a to 4d are mounted on the tables 2a to 2d, respectively. Each of the containers 4a to 4d is, for example, a container called a front opening unified pod (FOUP). Each of the containers 4a to 4d is configured to accommodate the substrate W therein.

The loader module LM has a chamber. The pressure in the chamber of the loader module LM is set to the atmospheric pressure. The loader module LM has a transport device TU1. The transport device TU1 is, for example, an articulated robot and is controlled by the controller MC. The transport device TU1 is configured to transport the substrate W through the chamber of the loader module LM. The transport device TU1 may transport the substrate W between each of the containers 4a to 4d and an aligner AN, between the aligner AN and each of load lock modules LL1 and LL2, and between each of the load lock module LL1 and LL2 and each of the container 4a to 4d. The aligner AN is connected to the loader module LM. The aligner AN is configured to adjust the position (correct the position) of the substrate W.

Each of the load lock module LL1 and the load lock module LL2 is provided between the loader module LM and the transport module TF. Each of the load lock module LL1 and the load lock module LL2 provides a preliminary decompression chamber.

The transport module TF is connected to each of the load lock module LL1 and the load lock module LL2 via a gate valve. The transport module TF has a transport chamber TC capable of being decompressed. The transport module TF has a transport device TU2. The transport device TU2 is, for example, an articulated robot and is controlled by the controller MC. The transport device TU2 is configured to transport the substrate W through the transport chamber TC. The transport device TU2 may transport the substrate W between each of the load lock modules LL1 and LL2 and each of the process modules PM1 to PM6 and between any two process modules among the process modules PM1 to PM6.

Each of the process modules PM1 to PM6 is a processing apparatus configured to perform a dedicated substrate processing. One process module among the process modules PM1 to PM6 is a layer forming apparatus. This layer forming apparatus is used to form the protective layer PF in step ST1. This layer forming apparatus is a plasma processing apparatus such as the plasma processing apparatus 1 or any other plasma processing apparatus when plasma is generated in step ST1. When the protective layer PF is formed without generating the plasma in step ST1, this layer forming apparatus may not have a configuration for generating the plasma.

Another process module among the process modules PM1 to PM6 is a substrate processing apparatus such as the plasma processing apparatus 1 or any other plasma processing apparatus. This substrate processing apparatus is used to etch the region RE in step ST2. This substrate processing apparatus may be used for etching in step STa and removal of the protective layer PF in step ST4. Alternatively, the etching in step STa may be performed using a substrate processing apparatus which is yet another process module among the process modules PM1 to PM6. Further, the removal of the protective layer PF in step ST4 may be performed using a substrate processing apparatus which is still yet another process module among the process modules PM1 to PM6.

In the substrate processing system PS, the controller MC is configured to control each component of the substrate processing system PS. The controller MC controls the layer forming apparatus so as to form the protective layer PF in step ST1. After forming the protective layer PF, the controller MC controls the substrate processing apparatus to etch the region RE in order to increase the depth of the opening OP. This substrate processing system PS may transport the substrate W between the process modules without bringing the substrate W into contact with the atmosphere.

Figure 11:
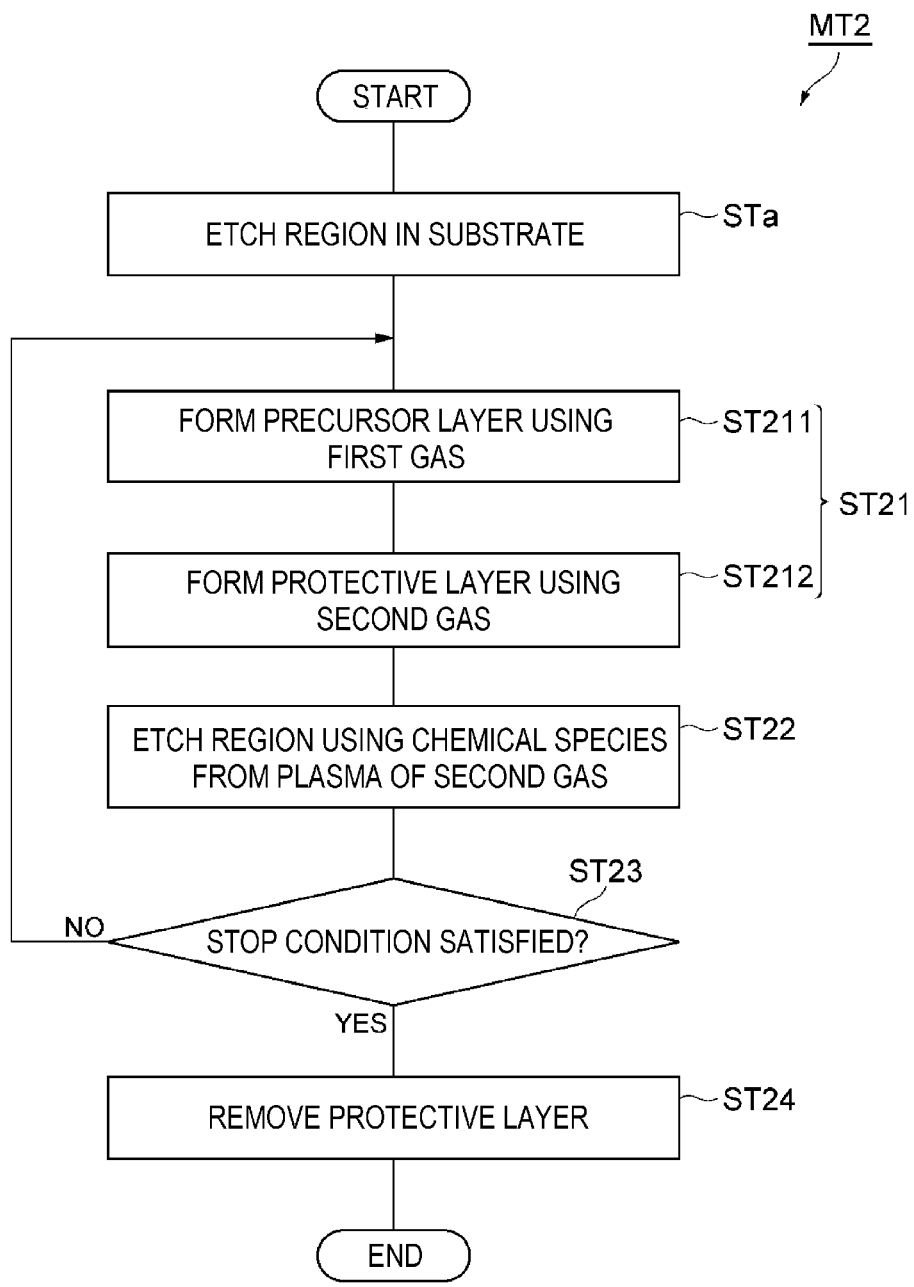
FIG. 11 is a flowchart of an etching method according to another embodiment.

Reference will be made to FIG. 11. FIG. 11 is a flowchart of an etching method according to another embodiment. The etching method illustrated in FIG. 11 (hereinafter referred to as "method MT2") is applied to a substrate. The method MT2 may be applied, for example, to the substrate W illustrated in FIG. 2. Hereinafter, the method MT2 will be described by taking as an example a case where the substrate W illustrated in FIG. 2 is processed using the plasma processing apparatus 1. In the method MT2, other substrate processing apparatuses may be used. In the method MT2, other substrates may be processed.

The method MT2 is performed in a state where the substrate W is placed on the substrate supporter 14. The method MT2 may be initiated in step STa. Step STa in the method MT2 is the same as step STa in the method MT. The method MT2 may not include step STa. In this case, the opening OP is provided in advance in the region RE of the substrate to which the method MT2 is applied. Alternatively, when the method MT2 does not include step STa, step ST21 and step ST22 in the method MT2 are applied to the substrate W illustrated in FIG. 2.

In step ST21, the protective layer PF is formed on the surface of the substrate W. Step ST21 includes step ST211 and step ST212. In step ST211, the precursor layer PC is formed on the surface of the substrate W. The precursor layer PC contains a tin atom. In step ST211, the first gas is used for the formation of the precursor layer PC. The first gas contains a tin-containing substance described above in relation to the method MT. The first gas used in step ST211 may further contain a carrier gas. The carrier gas is an inert gas. The inert gas is, for example, a noble gas or a nitrogen gas. In step ST211, as illustrated in FIG. 7A, the precursor layer PC is formed on the substrate W from the substance contained in the first gas. In step ST211, the precursor layer PC may be formed without generating plasma from the first gas. Alternatively, in step ST211, the precursor layer PC may be formed using chemical species from the plasma generated from the first gas.

In step ST211, the controller 80 controls the gas supply GS so as to supply the first gas into the chamber 10. In step ST211, the controller 80 controls the exhaust device 50 so as to set the pressure of the gas within the chamber 10 to a designated pressure. When plasma is generated in step ST211, the controller 80 controls the plasma generator so as to generate the plasma from a layer forming gas within the chamber 10. In one embodiment, in order to generate the plasma from the layer forming gas, the controller 80 controls the first radio-frequency power supply 62 and/or the second radio-frequency power supply 64 so as to supply the first radio-frequency power and/or the second radio-frequency power.

Step ST212 is performed after step ST211. In step ST212, the protective layer PF is formed from the precursor layer PC using chemical species from the plasma generated from the second gas. The substance contained in the second gas for forming the protective layer PF from the precursor layer PC may be the same as the substance in the second gas used in step ST13 of the method MT.

In the method MT2, step ST22 is performed during performance of step ST212. In other words, step ST212 and step ST22 are performed simultaneously. In step ST22, the region RE is etched by chemical species from the plasma generated from the second gas during performance of step ST212. The chemical species from the plasma which change the precursor layer PC into the protective layer PF and the chemical species from the plasma which etch the region RE may be the same as or different from each other. By performing steps ST212 and ST22 at the same time, as illustrated in FIG. 8B, the protective layer PF is formed from the precursor layer PC and at the same time, the region RE is etched and the depth of the opening OP increases.

When the first example of the substrate W described above is processed in the method MT2, i.e., when the region RE of the substrate W is an organic layer, the second gas may include an oxygen-containing gas. The oxygen-containing gas includes, for example, oxygen gas ($O_2$ gas), carbon monoxide gas, (CO gas) or carbon dioxide gas ($CO_2$ gas). In this case, the second gas may further include carbonyl sulfide gas. When the first example of the substrate W is processed in the method MT2, the second gas may include at least one of $O_2$, $CO_2$, $N_2$, $H_2$, $H_2O$, or an inorganic compound having an NH bond. The inorganic compound having an NH bond is, for example, $NH_3$ or $N_2H_2$. When the first example of the substrate W is processed in the method MT2, the protective layer PF is formed from the precursor layer PC by chemical species from the plasma formed from the second gas. Further, the region RE is etched by chemical specifies from the plasma formed from the second gas.

When the second example of the substrate W described above is processed in the method MT2, i.e., when the region RE of the substrate W is a low dielectric constant layer, the second gas includes fluorine and nitrogen. For example, the second gas includes a fluorocarbon gas and a nitrogen-containing gas. The fluorocarbon gas is, for example, a $C_4F_8$ gas. The nitrogen-containing gas is, for example, nitrogen gas ($N_2$ gas). In this case, the second gas may further include a noble gas (e.g., Ar gas) and/or an oxygen-containing gas. The oxygen-containing gas is, for example, oxygen gas ($O_2$ gas) or carbon dioxide gas ($CO_2$ gas). In this case, the protective layer PF is formed from the precursor layer PC from at least one of halogen chemical species, nitrogen chemical species, and oxygen chemical species from the plasma formed from the second gas. Further, the region RE is etched by fluorine chemical specifies from the plasma formed from the second gas.

When the third example of the substrate W described above is processed in the method MT2, i.e., when the region RE of the substrate W is a polycrystalline silicon layer, the second gas may include a halogen-containing gas and/or an oxygen-containing gas. The halogen-containing gas is, for example, HBr gas, $Cl_2$ gas, or $SF_6$ gas. The oxygen-containing gas includes, for example, oxygen gas, carbon monoxide gas, or carbon dioxide gas. In this case, the second gas may further include a noble gas (e.g., Ar gas). In this case, the protective layer PF is formed from the precursor layer PC by oxygen chemical species from the plasma formed from the second gas. Further, the region RE is etched by halogen chemical specifies from the plasma formed from the second gas.

When the fourth example of the substrate W in which the region RE is a silicon oxide layer is processed in the method MT2, the second gas includes a fluorocarbon gas. In this case, the second gas further includes an oxygen-containing gas and/or a nitrogen-containing gas. The fluorocarbon gas is, for example, $CF_4$ gas, $C_4F_6$ gas, or $C_4F_8$ gas. The oxygen-containing gas includes, for example, oxygen gas ($O_2$ gas), carbon monoxide gas, (CO gas) or carbon dioxide gas ($CO_2$ gas). The nitrogen-containing gas is, for example, nitrogen gas ($N_2$ gas). In this case, the second gas may further include a noble gas (e.g., Ar gas). In this case, the protective layer PF is formed from the precursor layer PC by oxygen chemical species and/or nitrogen chemical species from the plasma formed from the second gas. Further, the region RE is etched by fluorine chemical specifies from the plasma formed from the second gas.

When the fourth example of the substrate W in which the region RE is a silicon nitride layer is processed in the method MT2, the second gas includes a hydrofluorocarbon gas and/or an oxygen-containing gas. The hydrofluorocarbon gas is, for example, $CH_3F$ gas. The oxygen-containing gas includes, for example, oxygen gas ($O_2$ gas), carbon monoxide gas, (CO gas) or carbon dioxide gas ($CO_2$ gas). In this case, the second gas may further include a noble gas (e.g., Ar gas). In this case, the protective layer PF is formed from the precursor layer PC from oxygen chemical species from the plasma formed from the second gas. Further, the region RE is etched by fluorine chemical specifies from the plasma formed from the second gas.

When the fourth example of the substrate W in which the region RE is a multilayer including a silicon oxide layer and a silicon nitride layer which are alternately stacked is processed in the method MT2, the second gas includes a fluorocarbon gas and a hydrofluorocarbon gas. In this case, the second gas may further include an oxygen-containing gas and/or a nitrogen-containing gas. In this case, the second gas may further include a noble gas (e.g., Ar gas). In this case, the protective layer PF is formed from the precursor layer PC from oxygen chemical species or nitrogen chemical species from the plasma formed from the second gas. Further, the region RE is etched by fluorine chemical specifies from the plasma formed from the second gas.

When the fourth example of the substrate W in which the region RE is a multilayer including a silicon oxide layer and a polycrystalline silicon layer which are alternately stacked is processed in the method MT2, the second gas includes a fluorocarbon gas and a halogen-containing gas. The fluorocarbon gas is, for example, $CF_4$ gas, $C_4F_6$ gas, or $C_4F_8$ gas. The halogen-containing gas is, for example, HBr gas or $Cl_2$ gas. In this case, the second gas may further include an oxygen-containing gas and/or a nitrogen-containing gas. In this case, the second gas may further include a noble gas (e.g., Ar gas). In this case, the protective layer PF is formed from the precursor layer PC by oxygen chemical species or nitrogen chemical species from the plasma formed from the second gas. Further, the region RE is etched by fluorine chemical species and halogen chemical species from the plasma formed from the second gas.

In step ST212 and step ST22, the controller 80 controls the gas supply GS so as to supply the second gas into the chamber 10. In step ST212 and step ST22, the controller 80 controls the exhaust device 50 so as to set the pressure of the gas within the chamber 10 to a designated pressure. In step ST212 and step ST22, the controller 80 controls the plasma generator in order to generate plasma from the second gas. In step ST212 and step ST22, the controller 80 controls the first radio-frequency power supply 62 and/or the second radio-frequency power supply 64 so as to supply the first radio-frequency power and/or the second radio-frequency power.

In the method MT2, a plurality of cycles each including step ST21 and step ST22 may be sequentially performed. When the plurality of cycles are sequentially performed, it is determined in step ST23 whether or not a stop condition is satisfied. The stop condition is satisfied when the number of times the cycle is performed reaches a predetermined number of times. When it is determined in step ST23 that the stop condition is not satisfied, the cycle is performed again. When it is determined in step ST23 that the stop condition is satisfied, then step ST24 may be performed. Step ST24 is the same as step ST4.

The method MT2 may be performed using the substrate processing system PS. In this case, step ST211 is performed using one of the process modules PM1 to PM6 which is a layer forming apparatus. Further, step ST212 and step ST22 are performed using another process module of the process modules PM1 to PM6 which is the plasma processing apparatus 1 or any other plasma processing apparatus. Further, step ST24 is performed using one of the process modules PM1 to PM6 which is the plasma processing apparatus 1 or any other plasma processing apparatus. The process module used in step ST24 may be the process module used in step ST221 and step ST22, or may be another process module.

As described above, in the method MT2, step ST212 and step ST22 are performed at the same time. That is, the generation of chemical species which change the precursor layer PC into the protective layer PF and the generation of chemical species which etch the region RE are performed at the same time. Accordingly, the method MT2 has a high throughput. In this way, step ST21 and step ST22 may be performed at least partially simultaneously.

Figure 12:
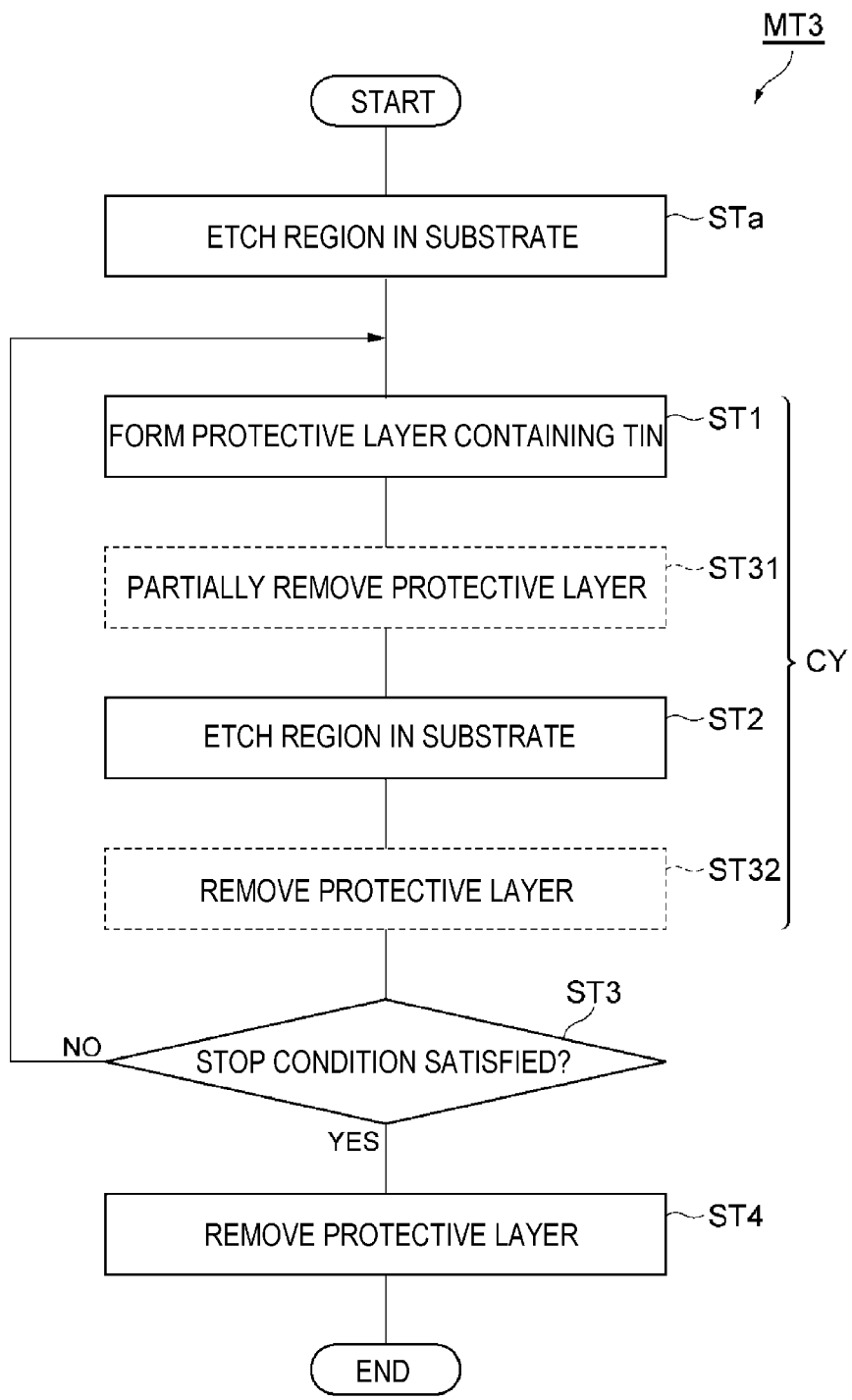
FIG. 12 is a flowchart of an etching method according to still another embodiment.
Figure 13:
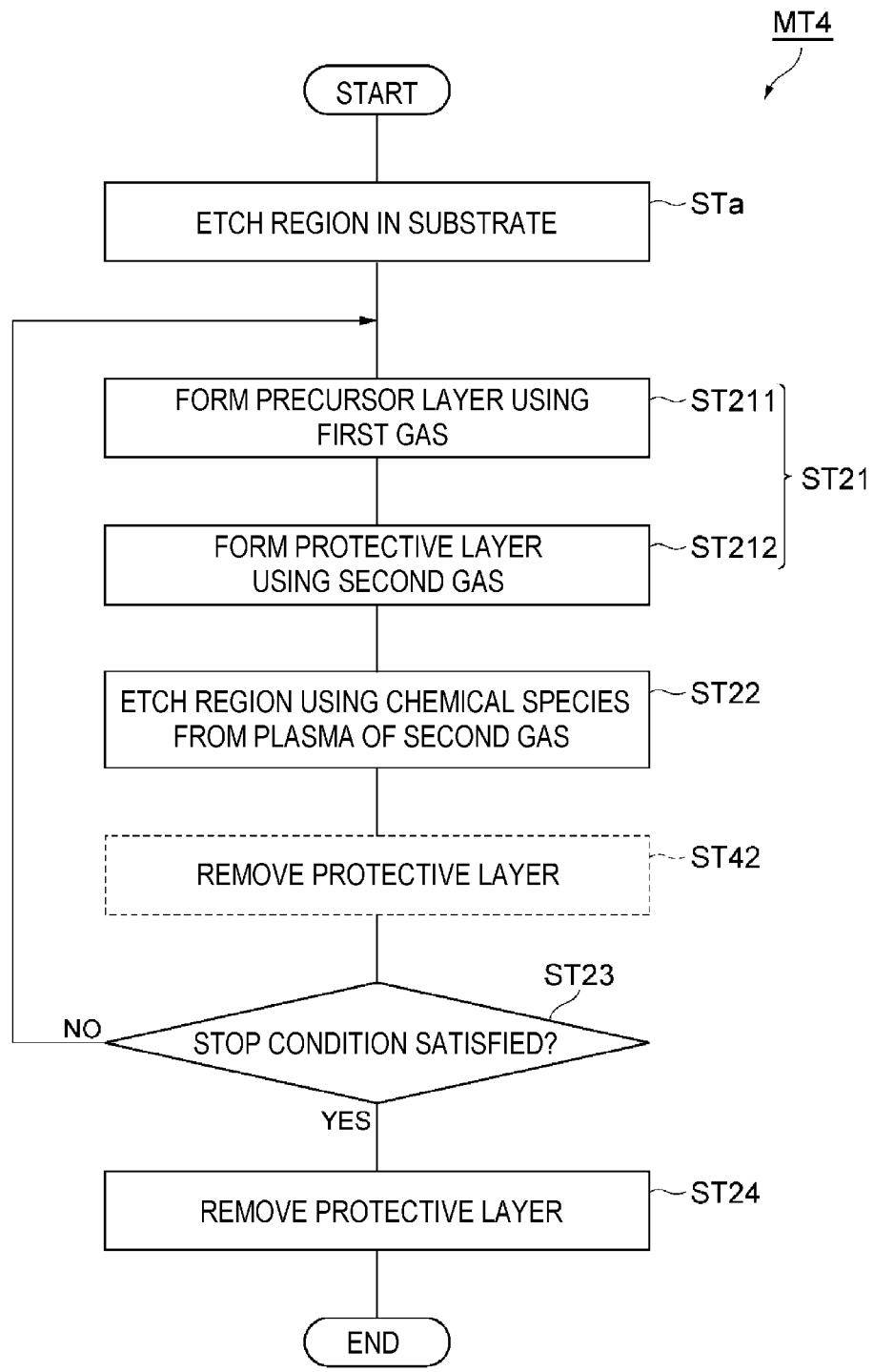
FIG. 13 is a flowchart of an etching method according to a further embodiment.
Figure 14A:
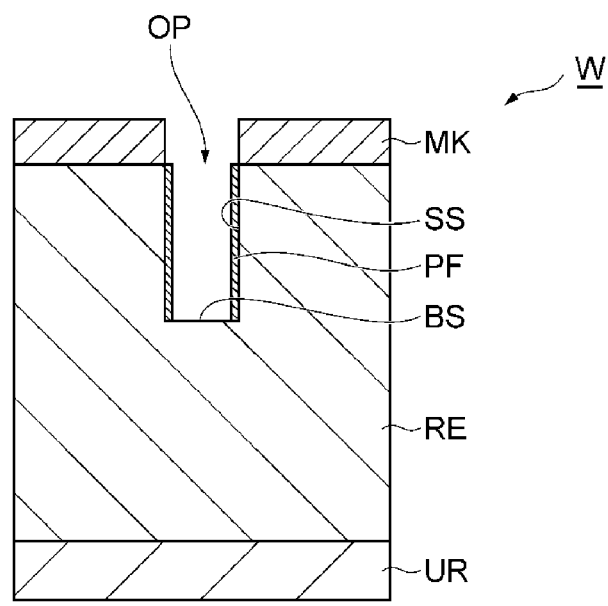
FIGS. 14A and 14B are partially enlarged cross-sectional view of an example substrate in a state after step ST31 of FIG. 12 is performed, respectively.
Figure 14B:
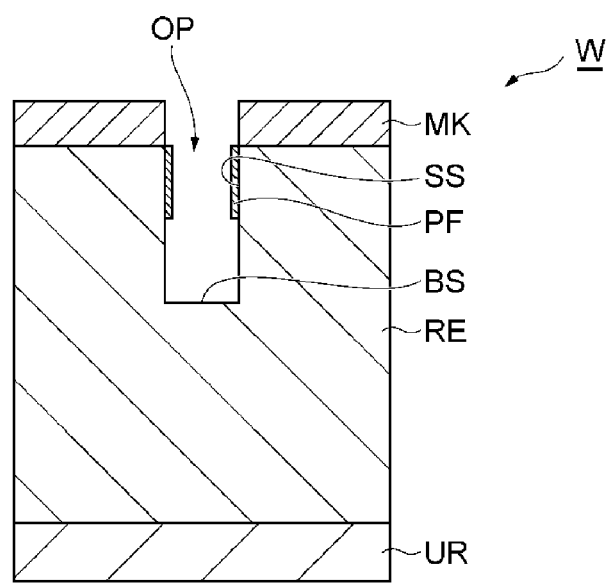
Figure 15A:
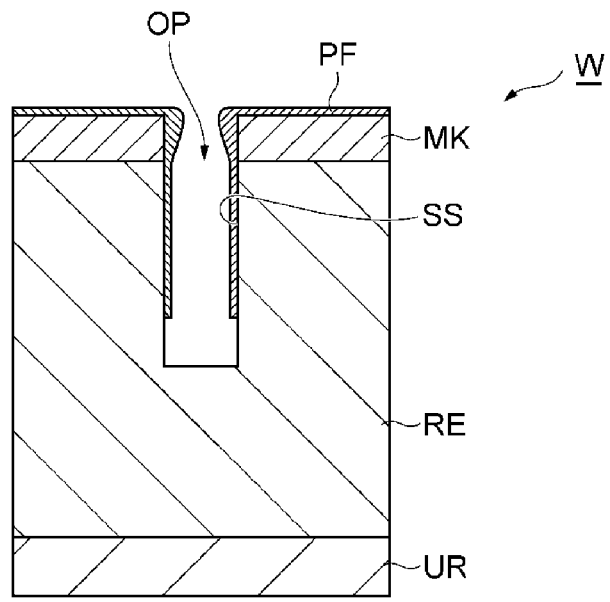
FIG. 15A is a partially enlarged cross-sectional view of an example substrate in a state after step ST2 of FIG. 12 or step ST22 of FIG. 13 is performed.
Figure 15B:
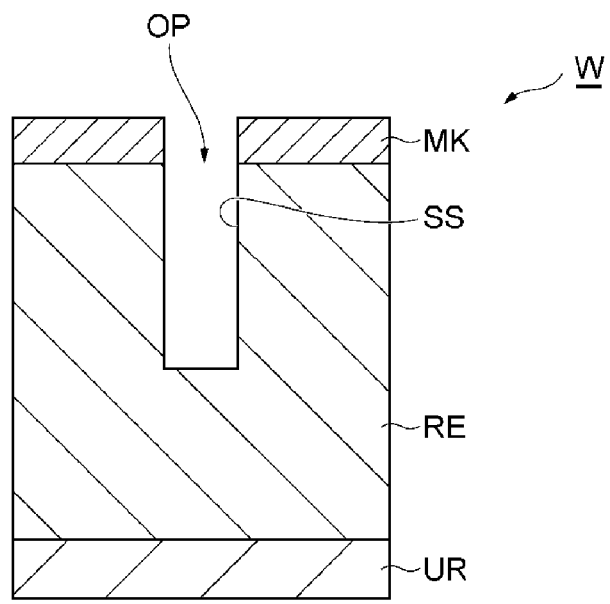
FIG. 15B is a partially enlarged sectional view of the example substrate in a state after step ST32 of FIG. 12 or step ST42 of FIG. 13 is performed.

Hereinafter, reference will be made to FIGS. 12, 13, 14A, 14B, 15A and 15B. Each of FIGS. 12 and 13 is a flowchart of an etching method according to a further embodiment. FIGS. 14A and 14B are partially enlarged cross-sectional view of an example substrate in a state after step ST31 of FIG. 12 is performed, respectively. FIG. 15A is a partially enlarged cross-sectional view of an example substrate in a state after step ST2 of FIG. 12 or step ST22 of FIG. 13 is performed. FIG. 15B is a partially enlarged cross-sectional view of an example substrate in a state after step ST32 of FIG. 12 or step ST42 of FIG. 13 is performed.

The etching method illustrated in FIG. 12 (hereinafter referred to as "method MT3") is different from the method MT in that it includes step ST31 and/or step ST32. One or more of all cycles CY of the method MT3 may include step ST31 and/or step ST32. Alternatively, all of the cycles CY of the method MT3 may include step ST31 and/or step ST32.

The etching method illustrated in FIG. 13 (hereinafter referred to as "method MT4") is different from the method MT in that it includes step ST42. In the method MT4, one or more of a plurality of cycles each including step ST21 and step ST22 may include step ST42. Alternatively, in the method MT4, all of the plurality of cycles each including step ST21 and step ST22 may include step ST42.

Step ST31 of the method MT3 is performed between step ST1 and step ST2. In step ST31, the protective layer PF is partially removed. When step ST31 is applied to the substrate illustrated in FIG. 7B, a portion of the entire protective layer PF covering the mask MK is removed as illustrated in FIG. 14A. Further, when step ST31 is applied to the substrate illustrated in FIG. 9B, a portion of the entire protective layer PF covering the mask MK is removed as illustrated in FIG. 14B. According to step ST31, the width of the opening of the mask MK is adjusted before the etching in the step ST2. The processing for partially removing the protective layer PF in step ST31 is the same as the processing in step ST4.

Step ST32 of the method MT3 is performed after step ST2 in the cycle CY. Further, step ST42 of the method MT4 is performed after step ST22 in the cycle including step ST21 and step ST22. After the etching of each of step ST2 and step ST22, the protective layer PF may reduce the width of the opening in the vicinity of the upper end of the opening of the mask MK, as illustrated in FIG. 15A. This is because the protective layer PF is deformed by the etching of each of step ST2 and step ST22, or because the constituent material of the protective layer PF etched in each of step ST2 and step ST22 is reattached to the substrate. In each of step ST32 and step ST42, the protective layer PF is removed as illustrated in FIG. 15B. As a result, the obstruction of the opening of the mask MK by the protective layer PF is suppressed. The processing for removing the protective layer PF in each of step ST32 and step ST42 is the same as the processing in step ST4 or step ST24. In each of step ST32 and step ST42, the protective layer PF may be completely removed, or may be partially removed so as to prevent the obstruction of the opening of the mask MK.

Although various embodiments have been described above, various additions, omissions, substitutions, and changes may be made without being limited to the above-described embodiments. In addition, it is also possible to combine elements in different embodiments to form other embodiments.

For example, the substrate processing apparatus used for the performance of each of the method MT and the method MT2 may be any type of plasma processing apparatus. For example, the substrate processing apparatus used for the performance of each of the method MT and the method MT2 may be a capacitively coupled plasma processing apparatus other than the plasma processing apparatus 1. The substrate processing apparatus used for the performance of each of the method MT and the method MT2 may be an inductively coupled plasma processing apparatus, an electron cyclotron resonance (ECR) plasma processing apparatus, or a plasma processing apparatus using a surface wave such as a microwave for plasma generation. Further, when no plasma is used in the method MT, the substrate processing apparatus may not have the plasma generator.

Further, the region RE may be formed of a metal, a metal oxide, or a chalcogenide. Such a region RE may be etched in step STa, step ST2, and step ST22 by, for example, plasma formed from a gas including a halogen-containing gas.

According to one embodiment, it is possible to form a protective layer for etching on a substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. An etching method comprising:
providing a substrate having a region to be etched and a mask provided on the region to be etched, the region to be etched exposed through the mask and including a sidewall, the etching method further comprising:

(a) forming a protective layer containing a tin atom on the region to be etched exposed through the mask so that the protective layer covers the sidewall of the region to be etched; and (b) etching the region to be etched through the mask.

2. The method according to claim 1, wherein (b) is performed after (a).

3. The method according to claim 1, wherein (a) and (b) are performed at least partially simultaneously.

4. The method according to claim 1, wherein (a) includes:
(a-1) supplying a first gas to the substrate; and
(a-2) supplying a second gas to the substrate, and
wherein at least one of the first gas and the second gas contains a tin-containing substance.

5. The method according to claim 4, wherein in (a-1), a precursor layer is formed on a surface of the substrate using the first gas, and
in (a-2), the protective layer is formed from the precursor layer using the second gas.

6. The method according to claim 5, wherein the first gas contains the tin-containing substance, and
in (a-2), the protective layer is formed by oxidizing, nitriding, sulfurizing, reducing, or halogenating the precursor layer using the second gas.

7. The method according to claim 5, wherein in (a-2), plasma is generated from the second gas, and
in (b), the region to be etched is etched by chemical species from the plasma generated from the second gas during performance of (a-2).

8. The method according to claim 4, wherein a remaining one of the first gas and the second gas contains $H_2O$, $H_2O_2$, $O_2$, $O_3$, a nitrogen-containing inorganic compound including $N_2O_4$, a sulfur-containing inorganic compound, a halogen compound, a carbon-containing substance, a silicon-containing substance, or a tin-containing substance.

9. The method according to claim 4, wherein a remaining one of the first gas and the second gas contains at least one of $N_2$ and an oxygen-containing substance.

10. The method according to claim 4, wherein in (a), a plurality of layer forming cycles each including (a-1) and (a-2) is sequentially performed.

11. The method according to claim 1, wherein in (a), the protective layer is formed by a chemical vapor deposition method using a layer forming gas containing a tin-containing substance.

12. The method according to claim 11, wherein the layer forming gas further contains at least one of $N_2$, an oxygen-containing substance including $H_2O$, $H_2O_2$, $O_2$, and $O_3$, a nitrogen-containing inorganic compound including $N_2O_4$, a sulfur-containing inorganic compound, a halogen compound, a carbon-containing substance, a silicon-containing substance, or a noble gas.

13. The method according to claim 1, further comprising (c) etching the region to be etched before (a) to provide an opening having the sidewall in the region to be etched.

14. The method according to claim 13, wherein the protective layer has a thickness that varies according to a position in a depth direction within the opening.

15. The method according to claim 1, wherein a plurality of cycles each including (a) and (b) is sequentially performed.

16. The method according to claim 1, wherein the protective layer contains at least one of metallic tin, a tin oxide, a tin nitride, a tin sulfide, and a tin halide.

17. The method according to claim 1, wherein the mask is a hard mask, a photoresist, or a mask formed of a photoresist containing a tin atom.

18. The method according to claim 1, further comprising (d) removing the protective layer.

19. The method according to claim 1, wherein during forming of the protective layer, the protective layer is also formed on a sidewall of the mask.

20. An etching method comprising:
providing a substrate having a region to be etched and a mask provided on the region to be etched, the region to be etched exposed through the mask, the etching method further comprising:
(a) forming a protective layer containing a tin atom on the region to be etched exposed through the mask; and
(b) etching the region to be etched through the mask,
wherein a plurality of cycles each including (a) and (b) is sequentially performed.

21. An etching method comprising:
providing a substrate having a region to be etched and a mask provided on the region to be etched, the region to be etched exposed through the mask, the etching method further comprising:
(a) forming a protective layer containing a tin atom on the region to be etched exposed through the mask; and
(b) etching the region to be etched through the mask,
wherein (a) and (b) are performed at least partially simultaneously.

* * * * *

UNITED STATES PATENT AND TRADEMARK OFFICE
CERTIFICATE OF CORRECTION

| | | |
|---|---|---|
| PATENT NO. | : 11,651,971 B2 | Page 1 of 1 |
| APPLICATION NO. | : 17/351549 | |
| DATED | : May 16, 2023 | |
| INVENTOR(S) | : Kenta Ono et al. | |

It is certified that error appears in the above-identified patent and that said Letters Patent is hereby corrected as shown below:

On the Title Page

Item (73) Assignee
"MAX CO., LTD., Tokyo (JP)" should read as --TOKYO ELECTRON LIMITED, Tokyo (JP).--.

Signed and Sealed this
Fourth Day of July, 2023

Katherine Kelly Vidal
*Director of the United States Patent and Trademark Office*